US011616597B1

(12) United States Patent
Kutz et al.

(10) Patent No.: US 11,616,597 B1
(45) Date of Patent: Mar. 28, 2023

(54) HIERARCHICAL CYCLIC REDUNDANCY CHECK TECHNIQUES

(71) Applicant: QUALCOMM Incorporated, San Diego, CA (US)

(72) Inventors: Gideon Shlomo Kutz, Ramat Hasharon (IL); Amit Bar-Or Tillinger, Tel-Aviv (IL); Tal Oved, Modiin (IL); Yaron Laufer, Brookline, MA (US); Elad Meir, Ramat Gan (IL); David Yunusov, Holon (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/572,840

(22) Filed: Jan. 11, 2022

(51) Int. Cl.
*H04L 1/00* (2006.01)
(52) U.S. Cl.
CPC ............ *H04L 1/0061* (2013.01); *H04L 1/001* (2013.01); *H04L 1/003* (2013.01)
(58) Field of Classification Search
None
See application file for complete search history.

(56) References Cited

U.S. PATENT DOCUMENTS

| 5,844,918 A * | 12/1998 | Kato ..................... H04L 1/0083 714/751 |
| 8,266,513 B2 * | 9/2012 | Kim ..................... H03M 13/09 714/801 |
| 8,908,496 B2 | 12/2014 | Kadous |
| 9,312,883 B1 * | 4/2016 | Mendel ............... H03M 13/091 |
| 10,560,220 B2 | 2/2020 | Tirucherai Muralidharan et al. |
| 10,707,995 B2 | 7/2020 | Sun et al. |
| 11,265,019 B1 * | 3/2022 | Ebrahimzad ........ H03M 13/356 |
| 2009/0158120 A1 * | 6/2009 | Palanki ................ H04L 1/0086 714/758 |
| 2020/0021310 A1 | 1/2020 | Zheng et al. |
| 2020/0344016 A1 * | 10/2020 | Yoshimura ............ H04L 5/0042 |

FOREIGN PATENT DOCUMENTS

WO    WO-2011061030 A1    5/2011

\* cited by examiner

*Primary Examiner* — Mujtaba M Chaudry
(74) *Attorney, Agent, or Firm* — Qualcomm Incorporated

(57) ABSTRACT

Methods, systems, and devices for wireless communications are described. In some wireless communications system, a wireless device may append, during a first encoding stage, a first set of cyclic redundancy check bits having a first size to each code block of a plurality of code blocks and may concatenate two or more code blocks from the plurality of code blocks into a first set of code blocks, each code block of the two or more code blocks including the appended first set of cyclic redundancy check bits. The wireless device may further append, during a second encoding stage, a second set of cyclic redundancy check bits having a second size to the first set of code blocks, and may transmit a message comprising the plurality of code blocks including the appended first set of cyclic redundancy check bits and the appended second set of cyclic redundancy check bits.

30 Claims, 19 Drawing Sheets

HIERARCHICAL CYCLIC REDUNDANCY CHECK TECHNIQUES

FIELD OF TECHNOLOGY

The following relates to wireless communications, including hierarchical cyclic redundancy check (CRC) techniques.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems, which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as user equipment (UE).

A wireless multiple-access communications system may include one or more base stations or one or more network access nodes, each simultaneously supporting communication for multiple communication devices, which may be otherwise known as user equipment (UE). A wireless communications system may support a base station transmitting data to a UE, and the UE conveying feedback to the base station. In some cases, error-detecting code bits may be included with a transmission sent by either a base station or a UE, where the error-detecting code bits may inform a receiving device whether the transmission included errors.

SUMMARY

The described techniques relate to improved methods, systems, devices, and apparatuses that support hierarchical cyclic redundancy check (CRC) techniques. Generally, the described techniques provide for a wireless device (e.g., a base station or user equipment (UE)) appending CRC bits to concatenated groups of code blocks (CBs) in a number of stages. Such techniques may optimize a number of CRC bits used to protect each CB for decreased overhead and a decreased likelihood of CB failure misdetection and enabling efficient retransmission (e.g., retransmissions with a relatively high likelihood of including only failed CBs). For example, in some cases, the wireless device may determine a CRC hierarchy configuration and may optionally transmit an indication of the configuration to another device that will receive a message encoded using the CRC hierarchy configuration. The CRC configuration may indicate a vector of CRC bits for an L-stage CRC hierarchy, where each entry in the vector of CRC bits may correspond to a number of CRC bits appended to each CB or concatenated group of CBs at each stage for a vector of CB groups, where each entry in the vector of CB groups corresponds to a number of CBs in each concatenated group of CBs for each of the L stages. Each vector may be associated with a corresponding CRC polynomial function. Put another way, a transmitting device may append some number of CRC bits to each CB of a set of multiple CBs, then concatenate a subset of the CBs that include the appended of CRC bits. The transmitting device may then append another number of CRC bits to concatenated CBs, and then again concatenate additional CBs together, where additional CRC bit appending and concatenation may take place at subsequent stages to form a codeword to be transmitted to a receiving device.

If an error is detected in a received message encoded in accordance with the CRC hierarchy, the transmitting device may re-transmit a failed CB or some concatenated CBs based on a feedback message. For instance, in cases where a UE detects a failed CB based on a CRC error associated with the CRC bits appended at a first stage (e.g., where each group of CBs includes a single CB), then the base station may retransmit the failed CB. Likewise, if the UE detects a failed group of concatenated CBs based on a CRC error associated with the CRC bits appended at a second stage (e.g., where each group of CBs includes two or more CBs), then the base station may retransmit the failed group of concatenated CBs.

A method for wireless communication is described. The method may include appending, during a first encoding stage, a first set of CRC bits having a first size to each CB of a set of multiple CBs, concatenating two or more CBs from the set of multiple CBs into a first set of CBs, each CB of the two or more CBs including the appended first set of CRC bits, appending, during a second encoding stage, a second set of CRC bits having a second size to the first set of CBs, and transmitting a message including the set of multiple CBs including the appended first set of CRC bits and the appended second set of CRC bits.

An apparatus for wireless communication is described. The apparatus may include a processor, memory coupled with the processor, and instructions stored in the memory. The instructions may be executable by the processor to cause the apparatus to append, during a first encoding stage, a first set of CRC bits having a first size to each CB of a set of multiple CBs, concatenate two or more CBs from the set of multiple CBs into a first set of CBs, each CB of the two or more CBs including the appended first set of CRC bits, append, during a second encoding stage, a second set of CRC bits having a second size to the first set of CBs, and transmit a message including the set of multiple CBs including the appended first set of CRC bits and the appended second set of CRC bits.

Another apparatus for wireless communication is described. The apparatus may include means for appending, during a first encoding stage, a first set of CRC bits having a first size to each CB of a set of multiple CBs, means for concatenating two or more CBs from the set of multiple CBs into a first set of CBs, each CB of the two or more CBs including the appended first set of CRC bits, means for appending, during a second encoding stage, a second set of CRC bits having a second size to the first set of CBs, and means for transmitting a message including the set of multiple CBs including the appended first set of CRC bits and the appended second set of CRC bits.

A non-transitory computer-readable medium storing code for wireless communication is described. The code may include instructions executable by a processor to append, during a first encoding stage, a first set of CRC bits having a first size to each CB of a set of multiple CBs, concatenate two or more CBs from the set of multiple CBs into a first set of CBs, each CB of the two or more CBs including the appended first set of CRC bits, append, during a second encoding stage, a second set of CRC bits having a second size to the first set of CBs, and transmit a message including the set of multiple CBs including the appended first set of CRC bits and the appended second set of CRC bits.

Some examples of the method, apparatuses, and non-transitory computer-readable medium described herein may further include operations, features, means, or instructions for distributing the second set of CRC bits to each CB of the two or more CBs, where a first CB of the two or more CBs may be appended with a first portion of the second set of CRC bits and a second CB of the two or more CBs may be appended with a second portion of the second set of CRC bits.

Some examples of the method, apparatuses, and non-transitory computer-readable medium described herein may further include operations, features, means, or instructions for concatenating the first set of CBs and a second set of CBs into a third set of CBs, the second set of CBs including two or more additional CBs from the set of multiple CBs that each include the appended first set of CRC bits, where the second set of CBs may be appended with the second set of CRC bits and appending, during a third encoding stage, a third set of CRC bits having a third size to the concatenated first set of CBs and second set of CBs, where the message includes the set of multiple CBs including the appended first set of CRC bits, the appended second set of CRC bits, and the appended third set of CRC bits.

Some examples of the method, apparatuses, and non-transitory computer-readable medium described herein may further include operations, features, means, or instructions for distributing the third set of CRC bits to the first set of CBs and the second set of CBs, where the first set of CBs may be appended with a first portion of the third set of CRC bits and the second set of CBs may be appended with a second portion of the third set of CRC bits.

Some examples of the method, apparatuses, and non-transitory computer-readable medium described herein may further include operations, features, means, or instructions for transmitting a second message indicating a CRC configuration, where appending the first set of CRC bits, concatenating the two or more CBs, and appending the second set of CRC bits may be based on the CRC configuration.

In some examples of the method, apparatuses, and non-transitory computer-readable medium described herein, the second message may be transmitted via medium access control (MAC)-control element (CE) signaling, downlink control information (DCI), radio resource control (RRC) signaling, or any combination thereof.

In some examples of the method, apparatuses, and non-transitory computer-readable medium described herein, the first encoding stage and the second encoding stage may be from a set of multiple encoding stages for encoding the message, each encoding stage of the set of multiple encoding stages being associated with appending respective sets of CRC bits to one or more CBs of the set of multiple CBs.

Some examples of the method, apparatuses, and non-transitory computer-readable medium described herein may further include operations, features, means, or instructions for determining a set of CRC bits corresponding to respective encoding stages and one or more polynomial functions associated with the set of CRC bits and determining a number of the set of multiple CBs corresponding to the respective encoding stages, where appending the first set of CRC bits, concatenating the two or more CBs, and appending the second set of CRC bits may be based on the set of CRC bits, the one or more polynomial functions, the number of the set of multiple CBs, and the respective encoding stages.

Some examples of the method, apparatuses, and non-transitory computer-readable medium described herein may further include operations, features, means, or instructions for receiving a feedback message in response to the transmitted message and retransmitting one or more CBs from the set of multiple CBs based on the feedback message indicating a decoding failure associated with the one or more CBs including the appended first set of CRC bits having the first size or a decoding failure associated with the first set of CBs including the appended second set of CRC bits having the second size.

In some examples of the method, apparatuses, and non-transitory computer-readable medium described herein, retransmitting the one or more CBs from the set of multiple CBs may include operations, features, means, or instructions for retransmitting a single CB based on the feedback message indicating the decoding failure associated with the one or more CBs including the appended first set of CRC bits having the first size.

In some examples of the method, apparatuses, and non-transitory computer-readable medium described herein, retransmitting the one or more CBs from the set of multiple CBs may include operations, features, means, or instructions for retransmitting the first set of CBs based on the feedback message indicating the decoding failure associated with the first set of CBs including the appended second set of CRC bits having the second size.

Some examples of the method, apparatuses, and non-transitory computer-readable medium described herein may further include operations, features, means, or instructions for selecting a CRC encoding scheme from a set of multiple CRC encoding schemes, where appending the first set of CRC bits, concatenating the two or more CBs, and appending the second set of CRC bits may be based on the CRC encoding scheme.

In some examples of the method, apparatuses, and non-transitory computer-readable medium described herein, the CRC encoding scheme indicates whether the second set of CRC bits may be appended to a last CB of the first set of CBs or distributed to each CB of the first set of CBs.

In some examples of the method, apparatuses, and non-transitory computer-readable medium described herein, the CRC encoding scheme may be selected from a preconfigured list of CRC encoding schemes.

In some examples of the method, apparatuses, and non-transitory computer-readable medium described herein, the CRC encoding scheme may be semi-statically selected based on a channel type for transmitting the message, a size of respective CBs from the set of multiple CBs, or a size of CB groups, or any combination thereof.

In some examples of the method, apparatuses, and non-transitory computer-readable medium described herein, the CRC encoding scheme may be dynamically selected based on an error probability associated with transmitting the message.

In some examples of the method, apparatuses, and non-transitory computer-readable medium described herein, a total number of CRC bits of the message includes a sum of the first set of CRC bits and the second set of CRC bits.

In some examples of the method, apparatuses, and non-transitory computer-readable medium described herein, the second set of CRC bits may be appended to a temporally last CB of the first set of CBs based on concatenating the two or more CBs.

A method for wireless communication is described. The method may include receiving a message including a set of multiple CBs, where each CB of the set of multiple CBs is appended with a first set of CRC bits having a first size, and where two or more concatenated CBs of the set of multiple CBs are appended with a second set of CRC bits having a second size and attempting to decode the plurality of CBs based at least in part on receiving the message.

An apparatus for wireless communication is described. The apparatus may include a processor, memory coupled with the processor, and instructions stored in the memory. The instructions may be executable by the processor to cause the apparatus to receive a message including a set of multiple CBs, where each CB of the set of multiple CBs is appended with a first set of CRC bits having a first size, and where two or more concatenated CBs of the set of multiple CBs are appended with a second set of CRC bits having a second size and attempt to decode the plurality of CBs based at least in part on receiving the message.

Another apparatus for wireless communication is described. The apparatus may include means for receiving a message including a set of multiple CBs, where each CB of the set of multiple CBs is appended with a first set of CRC bits having a first size, and where two or more concatenated CBs of the set of multiple CBs are appended with a second set of CRC bits having a second size and means for attempting to decode the plurality of CBs based at least in part on receiving the message.

A non-transitory computer-readable medium storing code for wireless communication is described. The code may include instructions executable by a processor to receive a message including a set of multiple CBs, where each CB of the set of multiple CBs is appended with a first set of CRC bits having a first size, and where two or more concatenated CBs of the set of multiple CBs are appended with a second set of CRC bits having a second size and attempt to decode the plurality of CBs based at least in part on receiving the message.

Some examples of the method, apparatuses, and non-transitory computer-readable medium described herein may further include operations, features, means, or instructions for transmitting a feedback message indicating a decoding failure for one or more CBs including the appended first set of CRC bits, or a decoding failure for a first set of CBs including the appended second set of CRC bits, or any combination thereof.

Some examples of the method, apparatuses, and non-transitory computer-readable medium described herein may further include operations, features, means, or instructions for receiving a retransmission of a single CB based on the feedback message indicating the decoding failure associated with the one or more CBs including the appended first set of CRC bits.

Some examples of the method, apparatuses, and non-transitory computer-readable medium described herein may further include operations, features, means, or instructions for receiving a retransmission of the first set of CBs based on the feedback message indicating the decoding failure associated with the first set of CBs including the appended second set of CRC bits.

Some examples of the method, apparatuses, and non-transitory computer-readable medium described herein may further include operations, features, means, or instructions for receiving a second message indicating a CRC configuration, where the message includes the set of multiple CBs having the appended first set of CRC bits and the two or more concatenated CBs having the appended second set of CRC bits based on the CRC configuration.

In some examples of the method, apparatuses, and non-transitory computer-readable medium described herein, the second message may be received via MAC-CE signaling, DCI, RRC signaling, or any combination thereof.

In some examples of the method, apparatuses, and non-transitory computer-readable medium described herein, a first CB of the two or more concatenated CBs may be appended with a first portion of the second set of CRC bits and a second CB of the two or more concatenated CBs may be appended with a second portion of the second set of CRC bits.

In some examples of the method, apparatuses, and non-transitory computer-readable medium described herein, the message includes a third set of CRC bits appended to a concatenation of a first set of CBs and a second set of CBs, the first set of CBs including the two or more concatenated CBs with the second set of CRC bits appended to the first set of CBs, and the second set of CBs including two or more additional concatenated CBs with the second set of CRC bits appended to the second set of CBs and decoding the message may be based on the third set of CRC bits appended to the concatenation of the first set of CBs and the second set of CBs.

In some examples of the method, apparatuses, and non-transitory computer-readable medium described herein, a total number of CRC bits of the message includes a sum of the first set of CRC bits and the second set of CRC bits.

DETAILED DESCRIPTION

Figure 1:
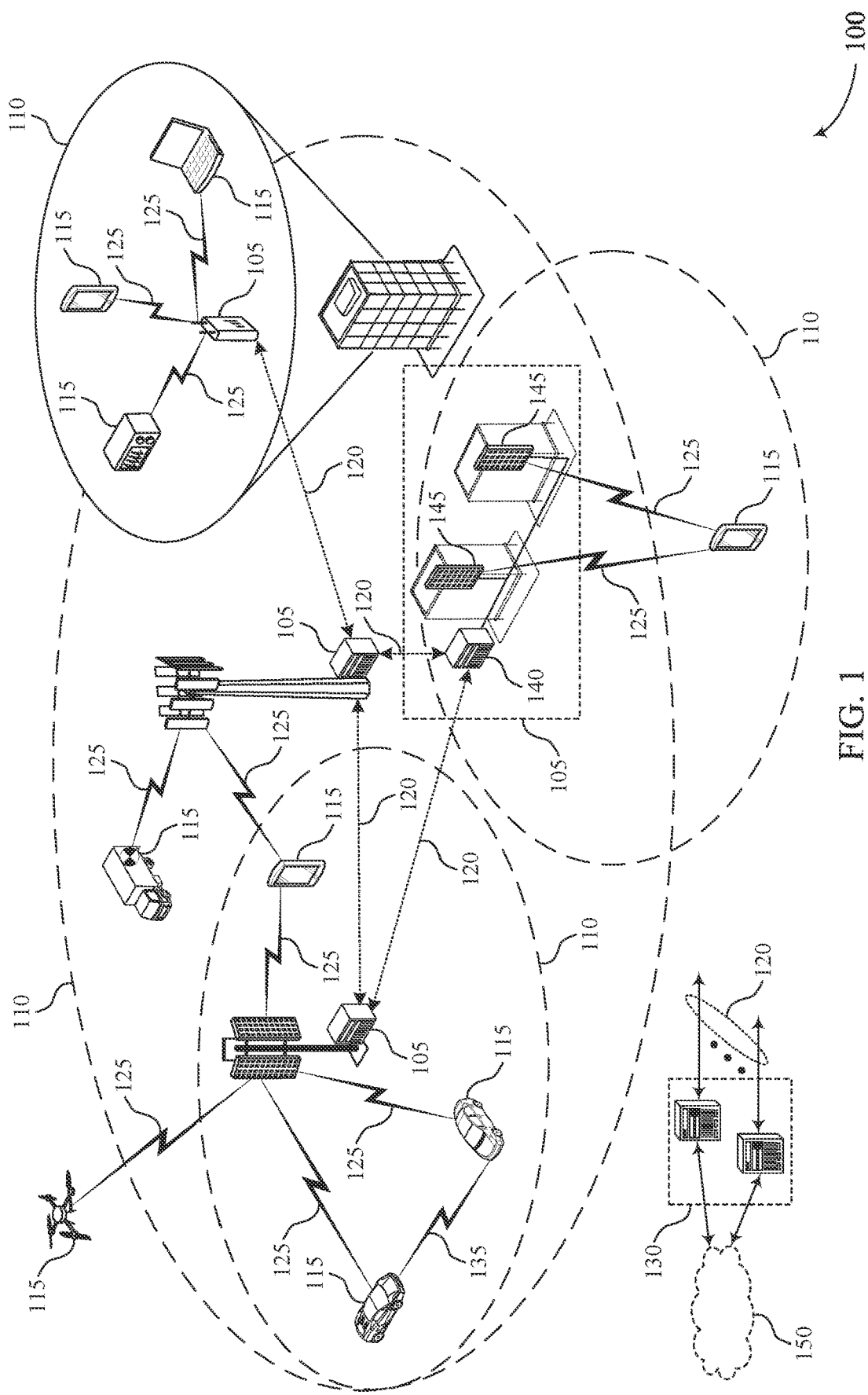
FIG. 1 illustrates an example of a wireless communications system that supports hierarchical cyclic redundancy check (CRC) techniques in accordance with aspects of the present disclosure.

In some wireless communications systems, a base station may use a multiple incremental redundancy scheme (MIRS) for rate adaption. For example, a base station may transmit data using a coding rate determined based on current channel conditions and interference at a particular time, and the base station may use MIRS for rate adaptation across a series of transmissions. In such cases, a first transmission may have a threshold modulation and coding scheme (MCS) that is expected to fail in a number of examples, and the MCS may be incrementally modified (e.g., based on feedback from a receiver) until a coding rate is identified that enables the receiver to successfully decode a transmission. The receiver (e.g., a user equipment (UE)) may use relatively small code blocks (CBs) to send feedback per CB (or per group of CBs) received in order to facilitate convergence on an appropriate MCS.

The use of a relatively high number of small CBs for MIRS feedback (or for other transmissions or communications schemes), however, may lead to increased overhead due to the addition of cyclic redundancy check (CRC) bits to each CB (or per CB group). For example, overhead due to CRC may be C/B, where B is the block size and C is the length of the CRC in bits. However, if the number of CRC bits is decreased to decrease the overhead, failure misdetection may increase and retransmission of successful CBs may be more likely, whereas increasing the number of CRC bits may create even larger overhead, thereby decreasing attainable throughput. For example, there may be a $1/2^C$ probability that the decoding of a CB failed while CRC is seemingly correct (e.g., no error is detected), which may be referred to as failure misdetection of the CRC and may make directly decreasing the CRC size inefficient.

Moreover, if feedback is transmitted for a group of CBs (or the CB size is increased) there may be losses in efficiency in the system as any potential re-transmissions by the base station may include CBs that already were successfully decoded.

To avoid relatively large overhead and decreased attainable throughput, a wireless device (e.g., a UE, a base station) may distribute CRC bits appended to different CBs and groups of concatenated CBs, enabling low CRC overhead and minimizing failure misdetection, while also providing for an efficient retransmission scheme (e.g., in which a retransmission may include only failed CBs). For example, a hierarchical CRC scheme may include iteratively appending relatively smaller quantities of CRC bits (e.g., compared to other techniques that use 24 bits) to CBs at respective encoding stages. For example, a wireless device may append a first set of CRC bits to each CB of a plurality of CBs during a first stage. At a second stage, the wireless device may group a number of CBs (e.g., concatenate some CBs) including the first set of CRC bits together into a first set of two or more CBs, and the device may append a second set of CRC bits to the first set of two or more CBs. In a third stage, the wireless device may concatenate the first set of two or more CBs (e.g., from the second stage) and another set of two or more CBs (that also has the second set of CRC bits appended), and the device may append a third set of CRC bits. That is, CRC bits may be appended to respective CBs during a first encoding stage, and subsequent encoding stages may append additional CRC bits to groups of CBs from a preceding stage such that each group of CBs of a latest stage may be protected by an effective CRC length of the sum of the CRC bits from each preceding stage but each CB of the group may not necessarily be appended with the total number of CRC bits thereby maintaining a low CRC overhead while minimizing failure misdetection and enabling efficient retransmission (e.g., retransmissions that may include only the failed CBs).

For example, if an error is detected, the wireless device may re-transmit one or more failed CBs (e.g., CBs that failed a CRC check) with different levels of granularity. For instance, in cases where the UE detects a failed CB based on a CRC error associated with the CRC bits appended at the first stage, then the wireless device may retransmit the failed CB. Likewise, if the UE detects a failed group of CBs based on a CRC error associated with the CRC bits appended at the second stage, then the wireless device may retransmit the failed group of CBs. The CRC scheme used for CB transmissions may be selected from a predetermined list of CRC schemes, and the selection may be done semi-statically (e.g., based on a channel type, CB size, or the like) or dynamically (e.g., based on a probability of errors in a re-transmission).

Aspects of the disclosure are initially described in the context of wireless communications systems. Aspects of the disclosure are then described in the context of various examples of a CRC hierarchy and a process flow. Aspects of the disclosure are further illustrated by and described with reference to apparatus diagrams, system diagrams, and flowcharts that relate to hierarchical CRC.

FIG. 1 illustrates an example of a wireless communications system 100 that supports hierarchical CRC techniques in accordance with aspects of the present disclosure. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable communications, low latency communications, communications with low-cost and low-complexity devices, or any combination thereof. In some aspects, a base station 105 may be referred to as, or may be an example of, a network equipment.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

In some examples, one or more components of the wireless communications system 100 may operate as or be referred to as a network node. As used herein, a network node may refer to any UE 115, base station 105, entity of a core network 130, apparatus, device, or computing system configured to perform any techniques described herein. For example, a network node may be a UE 115. As another example, a network node may be a base station 105. As another example, a first network node may be configured to communicate with a second network node or a third network node. In one aspect of this example, the first network node may be a UE 115, the second network node may be a base station 105, and the third network node may be a UE 115. In another aspect of this example, the first network node may be a UE 115, the second network node may be a base station 105, and the third network node may be a base station 105. In yet other aspects of this example, the first, second, and third network nodes may be different. Similarly, reference to a UE 115, a base station 105, an apparatus, a device, or a computing system may include disclosure of the UE 115, base station 105, apparatus, device, or computing system being a network node. For example, disclosure that a UE 115 is configured to receive information from a base station 105 also discloses that a first network node is configured to receive information from a second network node. In this example, consistent with this disclosure, the first network node may refer to a first UE 115, a first base station 105, a first apparatus, a first device, or a first computing system configured to receive the information; and the second network node may refer to a second UE 115, a second base station 105, a second apparatus, a second device, or a second computing system The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology. In some examples, a base station 105 may be an example of, or may include aspects of, a network equipment.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

One or more numerologies for a carrier may be supported, where a numerology may include a subcarrier spacing ($\Delta f$) and a cyclic prefix. A carrier may be divided into one or more BWPs having the same or different numerologies. In some examples, a UE 115 may be configured with multiple BWPs. In some examples, a single BWP for a carrier may be active at a given time and communications for the UE 115 may be restricted to one or more active BWPs.

The time intervals for the base stations 105 or the UEs 115 may be expressed in multiples of a basic time unit, which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

Each base station 105 may provide communication coverage via one or more cells, for example a macro cell, a small cell, a hot spot, or other types of cells, or any combination thereof. The term "cell" may refer to a logical communication entity used for communication with a base station 105 (e.g., over a carrier) and may be associated with an identifier for distinguishing neighboring cells (e.g., a physical cell identifier (PCID), a virtual cell identifier (VCID), or others). In some examples, a cell may also refer to a geographic coverage area 110 or a portion of a geographic coverage area 110 (e.g., a sector) over which the logical communication entity operates. Such cells may range from smaller areas (e.g., a structure, a subset of structure) to larger areas depending on various factors such as the capabilities of the base station 105. For example, a cell may be or include a building, a subset of a building, or exterior spaces between or overlapping with geographic coverage areas 110, among other examples.

A macro cell generally covers a relatively large geographic area (e.g., several kilometers in radius) and may allow unrestricted access by the UEs 115 with service subscriptions with the network provider supporting the macro cell. A small cell may be associated with a lower-powered base station 105, as compared with a macro cell, and a small cell may operate in the same or different (e.g., licensed, unlicensed) frequency bands as macro cells. Small cells may provide unrestricted access to the UEs 115 with service subscriptions with the network provider or may provide restricted access to the UEs 115 having an association with the small cell (e.g., the UEs 115 in a closed subscriber group (CSG), the UEs 115 associated with users in a home or office). A base station 105 may support one or multiple cells and may also support communications over the one or more cells using one or multiple component carriers.

In some examples, a carrier may support multiple cells, and different cells may be configured according to different protocol types (e.g., MTC, narrowband IoT (NB-IoT), enhanced mobile broadband (eMBB)) that may provide access for different types of devices.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

The core network 130 may provide user authentication, access authorization, tracking, Internet Protocol (IP) connectivity, and other access, routing, or mobility functions.

The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, for example, in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 (e.g., network equipment) or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

The wireless communications system 100 may be a packet-based network that operates according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use error detection techniques, error correction techniques, or both to support retransmissions at the MAC layer to improve link efficiency. In the control plane, the Radio Resource Control (RRC) protocol layer may provide establishment, configuration, and maintenance of an RRC connection between a UE 115 and a base station 105 or a core network 130 supporting radio bearers for user plane data. At the physical layer, transport channels may be mapped to physical channels.

The UEs 115 and the base stations 105 may support retransmissions of data to increase the likelihood that data is received successfully. Hybrid automatic repeat request (HARQ) feedback is one technique for increasing the likelihood that data is received correctly over a communication link 125. HARQ may include a combination of error detection (e.g., using a CRC), forward error correction (FEC), and retransmission (e.g., automatic repeat request (ARQ)). HARQ may improve throughput at the MAC layer in poor radio conditions (e.g., low signal-to-noise conditions). In some examples, a device may support same-slot HARQ feedback, where the device may provide HARQ feedback in a specific slot for data received in a previous symbol in the slot. In other cases, the device may provide HARQ feedback in a subsequent slot, or according to some other time interval.

In wireless communications system 100, the base station 105 may transmit data (e.g., to a UE 115) using a coding rate determined based on channel conditions, including channel interference, at a given point in time. In some cases, the base station 105 may implement a rate adaptation process to change the coding rate, where the base station 105 may transmit a CSI-RS to the UE 115, and the UE 115 may estimate the coding rate that the base station 105 may use to transmit to the UE 115 based on the CSI-RS. In some cases, current CSI-RS based channel capacity tracking schemes may not adapt to the instantaneous MCS (e.g., an MCS that may be decoded successfully on a specific TTI). For example, some wireless communications methods may underutilize the full available channel capacity. In some examples, the coding rate may remain constant until a new CSI-RS signal is received by the UE 115, which may be an inefficient use of resources as the channel conditions may vary between CSI-RS signals. Additionally or alternatively, transmitting CSI-RS signals constantly may introduce high signaling overhead. In some cases, CSI-RS channel estimation may inaccurately measure the performance of a receiver. Additionally, a channel state may be sampled at a discrete time (e.g., CSI-RS slots), even if in low velocities, the MCS (and coding rate) may change between those slots.

In some cases, the applied MCS, and more specifically, the applied coding rate, may be based on a first transmission, and the base station 105 may lack the ability to dynamically adapt the coding rate. In some examples, if the first transmission fails, the base station 105 may retransmit approximately the same number of coded bits. In some retransmission schemes, the base station 105 may use a small set of redundancy versions (RVs) to transmit the bits (e.g., retransmission of the bits). The bits may be the same bits as in the first transmission (e.g., Chase combining), which may result in the same coding rate. In some cases, the selected bits may be new coded bits (e.g., incremental redundancy), which may result in halving the effective coding rate in the second retransmission. As a result, it may be beneficial to estimate the coding rate on the first transmission. In some cases, overestimating the coding rate may result in decoding errors, which may lead to throughput loss. On the other hand, underestimating the coding rate may result in a loss of throughput as a larger payload may have been transmitted over the same channel resource. In some cases, link adaptation between CSI-RS slots may be performed using an outer loop link adaptation (OLLA) scheme. However, the base station 105 may lack the ability to track MCS changes accurately using the OLLA scheme.

In some examples, the base station 105 may use MIRS for rate adaptation. MIRS may achieve results close to that of a threshold MCS selection and achieve communications at a capacity code rate regardless of mobility (e.g., of a UE 115). In some cases, MIRS may be utilized if there is an overestimated coding rate (e.g., to ensure throughput is not lost due to an underestimated coding rate). The base station 105 may rely on extensive usage of small-sized retransmissions (e.g., of incremental redundancy (IR) HARQ (IR-HARQ) for fine, dynamic adaptation of the coding rate based on the ACK/NACK feedback from the receiving device (e.g., the UE). That is, each time the receiver sends a NACK, or alternatively, each time the receiver does not send an ACK, the small number of additional redundancy bits may be transmitted. The UE 115 may also use per-CB feedback to further maximize channel utilization.

In some cases, the base station 105 may utilize MIRS following a communications process. On a first transmission, the base station 105 (e.g., a transmitter) may select a threshold MCS that may be expected to fail in a number of examples. The selection may indicate the coding parameters, such as the coding rate and a transport block size (TBS), among others, for all of the following retransmissions. In some cases, for each decoding failure, the receiver (e.g., a UE 115) may transmit feedback to the base station 105 including per-CB decoding results. Additionally or alternatively, the UE 115 may convey additional information to allow the base station 105 faster convergency on the actual rate. In some cases, for each decoding failure, the base station 105 may schedule and send additional bits for each failing transport block (TB) (and optionally for each failing CB) from the initial buffered coded bits of the CBs. The added bits in each retransmission may be used to reduce the effective coding rate of each CB in fine steps until all CBs, and consequently the whole TB, are successfully decoded. In some cases, the total number of bits sent over the first and subsequent transmissions may determine the coding rate used for each TB.

In some cases, in addition to MIRS rate adaptation, the base station 105 may transmit relatively small CBs and may transmit feedback per CB in order to make potential retransmissions more efficient and to optimize throughput. This, however, may lead to large transmission overhead due to a CRC addition for each CB or CB group.

To minimize CRC overhead, a wireless device (e.g., a UE 115, a base station 105) may define a vector of CRC bits for an L-stage CRC hierarchy (e.g., $[c_1, c_2, \ldots, c_l]$) and a vector of CB groups (e.g., $[u_1, u_2, \ldots, u_L]$) and may iterate over the L stages, where for each encoding stage the wireless device may calculate a number of CRC bits, $c_1$, to append to each of a number of concatenated groups of $u_1$ CBs. For example, the wireless device may append $c_L$ bits to the last CB in each concatenated group in each encoding stage or may evenly divide the $c_1$ bits and may append a divided portion to each CB in the concatenated group during each encoding stage. In some examples, the term add, added, and adding, may be used similarly or interchangeably with append, append, and appending. For example, the wireless device may add $c_L$ bits to the last CB in each concatenated group in each encoding stage or may evenly divide the $c_1$ bits and may add a divided portion to each CB in the concatenated group during each encoding stage.

The wireless device (e.g., a base station 105) may transmit a message to another device (e.g., a UE 115) including the plurality of CBs appended with the CRC bits according to each of the L stages. In response, the base station 105 may receive feedback from the UE 115 indicating that one or more CRC bits are associated with an error and may retransmit a CB or a CB group based on whether the one or more CRC bits where appended in a first stage, a second stage, etc. That is, the wireless device may retransmit a group of one or more concatenated CBs appended with the one or more CRC bits associated with the error.

In accordance with aspects of the present disclosure, the various CRC levels may be added to the CBs such that failure miss detection may be independent, which may be naturally achieved by the concatenation structure of the CBs, and may be enhanced by selecting different polynomials even for equal-sized encoding stages. Implementing each encoding stage may ensure that each CB is protected by an effective CRC length of $\Sigma_l$ cl bits rather than appending each CB with the $\Sigma_l$ cl bits, which may result in relatively low instances of CRC-based erroneous decoding miss detection by a receiving device. Further, the total CRC overhead based on the encoding stages scheme is $$\sum_l \frac{c_l}{u_l},$$

providing overhead savings in contrast to appending each CB with the $\Sigma_l$ cl bits that may cause a CRC overhead of $$\frac{\sum_l cl}{B}.$$

Moreover, it an error is detected, the error may be detected in one of the bits appended during a first stage (e.g., where each group of CBs includes a single CB) and the base station may retransmit the failed CB even though, in some rarer cases, an error may be detected in one of the bits appended during a later stage (e.g., where each group of CBs includes two or more CBs) and the wireless device may retransmit the entire group of CBs thus decreasing the likelihood of error misdetection and enabling efficient retransmission (e.g., a retransmission with a relatively high likelihood of including only failed CBs).

Figure 2:
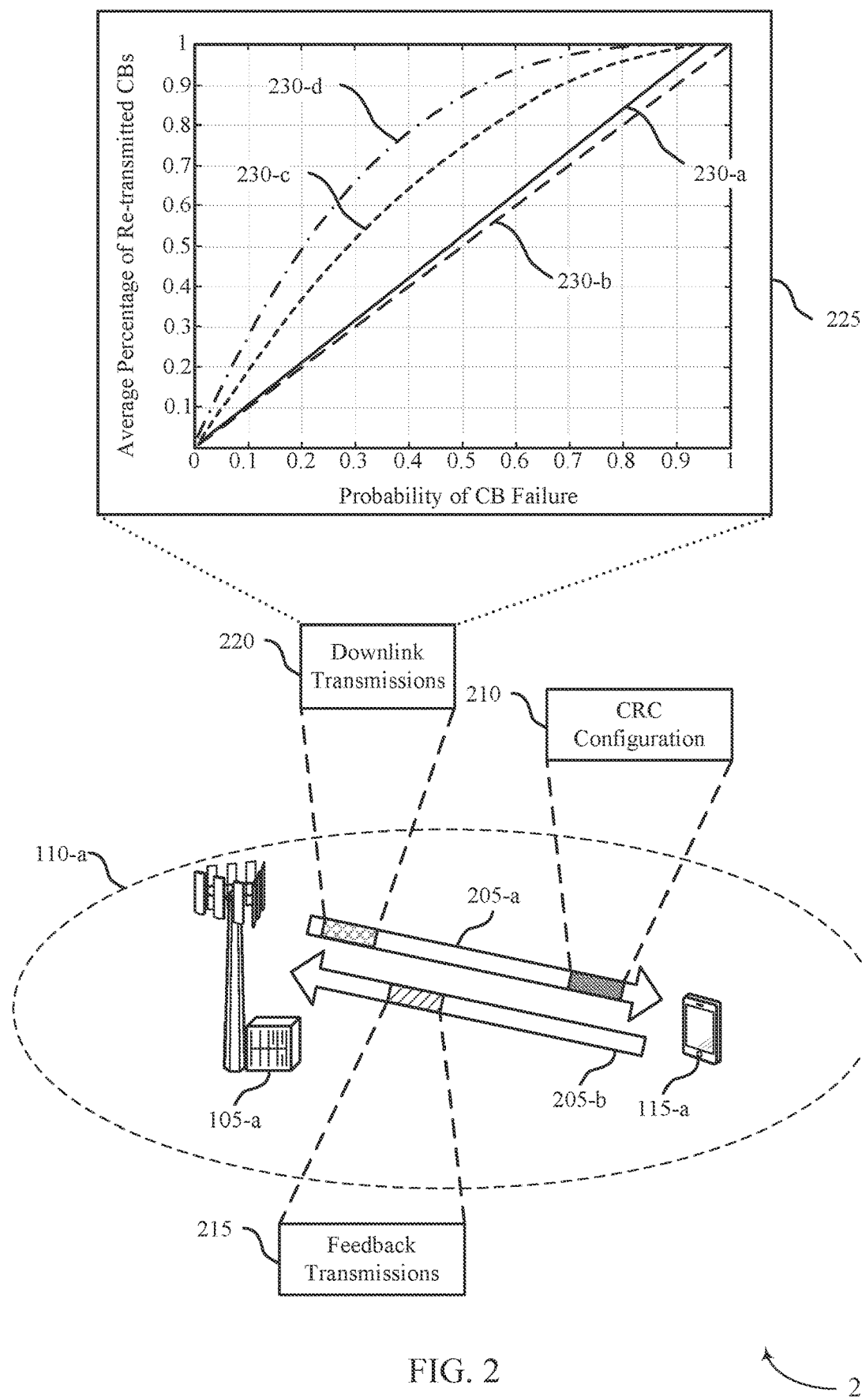
FIG. 2 illustrates an example of a wireless communications system that supports hierarchical CRC techniques in accordance with aspects of the present disclosure.

FIG. 2 illustrates an example of a wireless communications system 200 that supports hierarchical CRC techniques in accordance with aspects of the present disclosure. In some examples, the wireless communications system 200 may implement or be implemented by aspects of the wireless communications system 100. For example, the wireless communications system 200 may include a UE 115-a and a base station 105-a, which may be examples of a UE 115 and a base station 105 as described with reference to FIG. 1. In some aspects, the base station 105-a may be referred to as a network equipment. Additionally, the operations in wireless communications system 200 performed by UE 115-a and base station 105-a may be respectively performed by a UE 115, a base station 105, or another wireless device, and the example shown should not be construed as limiting. For instance, the operations shown as performed by UE 115-a may be performed by a base station 105, and the operations shown as performed by base station 105-a may be performed by a UE 115. Thus, the examples provided should not be considered limiting to the scope of the claims or the description.

The UE 115-a may communicate with the base station 105-a in a geographic coverage area 110-a supported by the base station 105-a. The geographic coverage area 110-a, which may be an example of a geographic coverage area 110 as described with reference to FIG. 1. As depicted in the example of FIG. 1, the base station 105-a may transmit one or more downlink signals to the UE 115-a via a communications link 205-a (e.g., a downlink communications link) and the UE 115-a may transmit one or more uplink signals to the base station 105-a via a communications link 205-b (e.g., an uplink communications link). In some cases, the UE 115-a may be configured by the base station 105-a to transmit feedback information 215 to the base station 105-a. In some cases, the base station 105-a may transmit a set of downlink transmissions 220 via the communications link 205-a, where the downlink transmissions 220 may include CBs. In response to receiving the downlink transmissions 220, the UE 115-a may transmit the feedback information 215 (e.g., ACK/NACK feedback) for the CBs received by the UE 115-a.

In some cases, MIRS rate adaptation may allow the base station 105-a and the UE 115-a to adapt the coding rate. For example, the base station 105-a may transmit the downlink transmissions 220 using a coding rate determined based on current channel conditions and interference at a particular time, and the base station 105-a may use MIRS for rate adaptation across a series of downlink transmissions 220. In such cases, a first transmission may have a threshold MCS that is expected to fail in a number of examples, and the MCS may be incrementally modified (e.g., based on the feedback information 215 from a receiver) until a coding rate is identified that may enable the UE 115-a to successfully decode a downlink transmission 220. The UE 115-a may use relatively small CBs to send feedback per CB (or per group of CBs) in order to facilitate convergence on an appropriate MCS.

The use of a relatively high number of CBs (e.g., relatively small CBs) for MIRS feedback (or for other transmissions), however, may lead to increased overhead due to the addition of CRC bits to each CB (or each group of CBs). However, if the number of CRC bits is decreased to reduce the overhead, failure misdetection may increase, whereas increasing the number of CRC bits may create even larger overhead, thereby decreasing attainable throughput. Moreover, if feedback is transmitted for a group of CBs (or the CB size is increased) there may be losses in efficiency in the system.

To avoid large overhead and decreased attainable throughput, the base station 105-a may append CRC bits to different CBs and groups of concatenated CBs, enabling low CRC overhead and minimizing failure misdetection, while also providing for an efficient retransmission scheme (e.g., in which a retransmission may include only failed CBs). For example, a hierarchical CRC scheme may include iteratively appending relatively smaller quantities of CRC bits (e.g., compared to other techniques that use 24 bits) to CBs at respective encoding stages according to a CRC configuration 210. For example, the base station 105-a may append a first set of CRC bits to each CB of a plurality of CBs of a downlink transmission 220 during a first stage. During a second stage, the base station 105-a may group a number of CBs (e.g., concatenate some CBs) each including the first set of CRC bits together into a first group of two or more CBs, and the base station 105-a may append a second set of CRC bits to the first group of two or more CBs. In a third stage, the base station 105-a may concatenate the first group of two or more CBs (e.g., from the second stage) with another group of two or more CBs (that also has the second set of CRC bits appended), and the base station 105-a may append a third set of CRC bits. That is, CRC bits may be appended to respective CBs during a first encoding stage, and subsequent encoding stages may include appending additional CRC bits to groups of concatenated CBs such that each group of CBs of a latest stage may be protected by an effective CRC length of the sum of the CRC bits appended during each stage but each CB of the group may not necessarily be appended with the total number of CRC bits thereby maintaining a low CRC overhead while minimizing failure misdetection and enabling efficient retransmission (e.g., retransmissions that may only include failed CBs)

For example, if an error is detected, the base station 105-a may re-transmit a failed CB. For instance, the UE 115-a may receive a CRC configuration 210 and a downlink transmission 220 including a set of CBs and the CRC bits from each stage and may attempt to decode the CBs, in some examples, according to the CRC configuration. In some other examples, the UE 115-a may attempt to decode the CBs without receiving the CRC configuration 210 (e.g., where the format of the CRC bits for received message may be predetermined). In cases where the UE 115-a detects a failed CB based on a CRC error associated with the CRC bits appended at the first stage, then the base station 105-a may retransmit the failed CB. Likewise, if the UE 115-a detects a failed CB of the set of CBs (e.g., is unable to decode a CB of the set of CBs) based on a CRC error associated with the CRC bits appended at the second stage, then the base station 105-a may retransmit the group of CBs associated with the second stage CRC bits. The CRC scheme used for CB transmissions may be selected from a predetermined list of CRC schemes, and the selection may be done semi-statically (e.g., based on a channel type, CB size, or the like) or dynamically (e.g., based on a probability of errors in a re-transmission).

In one illustrative example, a five-stage CRC hierarchy may be configured by the base station 105-a. As such, c=[5, 3, 4, 4, 8] and u=[1, 2, 4, 8, 32]. That is, at a first encoding stage of the five stage CRC hierarchy, 5 CRC bits may be appended to respective CBs; at a second encoding stage of the five stage CRC hierarchy, 3 CRC bits may be appended to each group of two concatenated CBs; at a third encoding stage of the five stage CRC hierarchy, four CRC bits may be appended to each group of four concatenated CBs; at a fourth encoding stage of the five stage CRC hierarchy, four CRC bits may be appended to each group of eight concatenated CBs; and at a fifth encoding stage of the five stage CRC hierarchy, eight CRC bits may be appended to each group of thirty two (32) concatenated CBs. In such cases, all of the CBs may be protected by a 24-bit CRC (e.g., $\Sigma_i c_i = c_1 + c_2 + c_3 + c_4 + c_5 = 5 + 3 + 4 + 4 + 8 = 24$), whereas the CRC bits-per-CB is only about 8.25 bits $$\left(e.g., \sum_l \frac{c_l}{u_l} = \frac{c_1}{u_1} + \frac{c_2}{u_2} + \frac{c_3}{u_3} + \frac{c_4}{u_4} + \frac{c_5}{u_5} = \frac{5}{1} + \frac{3}{2} + \frac{4}{4} + \frac{4}{8} + \frac{8}{32} = 8.25\right).$$

In this example, given a CB failure probability of p, a probability of failure misdetection (fmd) at level l (from l=2) may be represented by Equation 1:

$$p(fmd_{l-1}) = \sum_k \binom{u_l}{k} p^k (1-p)^{u_l-k} \left(1 - \left(1 - \frac{1}{2^{\left(\sum_{n=0}^{l-1} u_n\right)}}\right)^k\right) \quad (1)$$

Here, $\Sigma_k \binom{u_l}{k} p^k (1-p)^{u_l-k}$ may represent a number of failures, k, out of $u_l$ CBs and $$\left(1 - \left(1 - \frac{1}{2^{\left(\sum_{n=0}^{l-1} u_n\right)}}\right)^k\right)$$

may represent a probability of failure misdetection given k failures, and where $\binom{u_l}{k}$ may represent a vector having components k and $u_l$. A number of superfluous CBs sent due to the distributed CRC structure may therefore be about equal to $\Sigma_l p(fmd_{l-1})(u_l-1)/u_l$.

In other CRC encoding schemes different from the hierarchical CRC techniques described herein, an expected number of CBs to be transmitted may be equal to p. In such cases, and based on Equation 1, if CRC bits are appended to every two CBs, the expected number of CBs to be re-transmitted may be represented as $1-(1-p)^2 \approx 2p$, and the number of CRC bits per CB may be 12 bits (e.g., 24 bits/2). By contrast, in the example of the five-stage CRC hierarchy described above, a number of CBs to be retransmitted may be equal to about 1.04p, while including about 8.25 CRC bits per CB, thereby achieving reduced CRC overhead with a relative decrease in a number of retransmitted CBs.

For example, the graph 225 demonstrates various examples of an average percentage of retransmitted CBs as a function of a probability of CB failure. In this example, the function 230-a illustrates the average percentage of retransmitted blocks, where an average number of CRC bits per CB is about 8.25 bits, for example, when using a hierarchical CRC encoding scheme as described herein. The function 230-b illustrates an average percentage of retransmitted CBs in cases where the CRC bits are appended to each CB and an average number of CRC bits per CB is about 24 bits. Here, the function 230-a and 230-b may have a similar average percentage of re-transmitted CBs, but the function 230-a and the hierarchical CRC scheme achieves a relatively reduced CRC overhead with relatively fewer CRC bits per CB.

In addition, the functions 230-c and 230-d illustrate the effects of decreasing the number of CRC bits per CB when using techniques other than the hierarchical CRC scheme described herein. For instance, the function 230-c demonstrates an average percentage of retransmitted CBs in cases where the CRC bits are appended to every two CBs and an average number of CRC bits per CB is about 12 bits. The function 230-d demonstrates an average percentage of retransmitted CBs in cases where the CRC bits are appended to every third CB and an average number of CRC bits per CB is about 8 bits. In either case, a relatively higher percentage of re-transmitted CBs may result from reducing the number of CRC bits per CB when using techniques other than the described hierarchical CRC scheme. Thus, as illustrated by the graph 225, the function 230-a provides a scheme for a reduced average number of CRC bits per CB (e.g., about 8.25 bits) while performing better or similarly in average percentage of retransmitted CBs to the function 230-b having an average number of CRC bits per CB of about 12. Thus, the described techniques provide for the reduction of CRC overhead.

Figure 3:
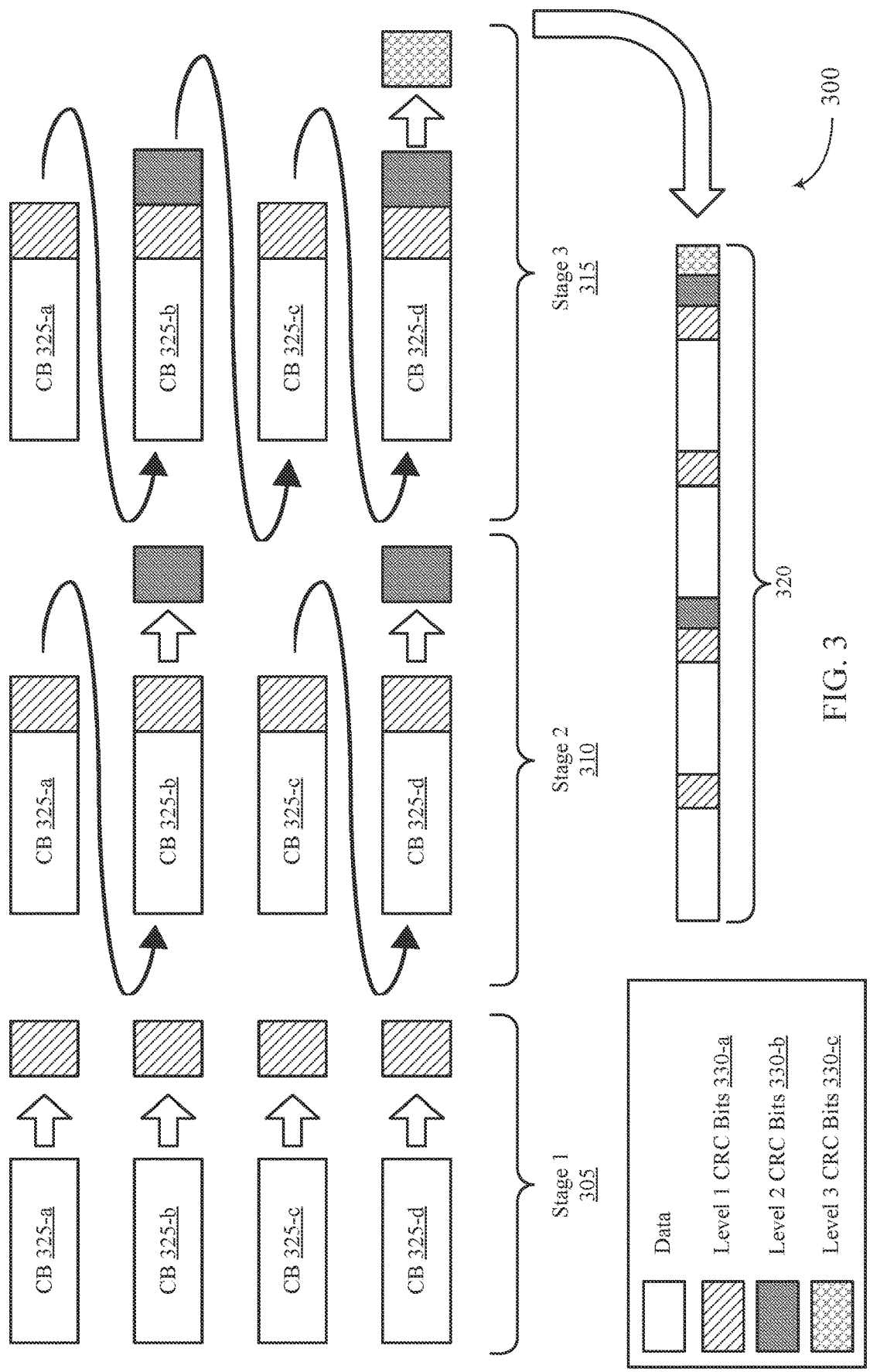
FIGS. 3 and 4 illustrate examples of a CRC hierarchy that supports hierarchical CRC techniques in accordance with aspects of the present disclosure.

FIG. 3 illustrates an example of a CRC hierarchy 300 that supports hierarchical CRC techniques in accordance with aspects of the present disclosure. In some examples, the CRC hierarchy 300 may implement or be implemented by aspects of wireless communications system 100, for example, by a UE 115 and a base station 105 (e.g., network equipment) as described with reference to FIGS. 1 and 2.

As described herein, a wireless device may append CRC bits to CBs using a hierarchical, distributed CRC scheme. For example, over two or more stages (e.g., first stage 305, second stage 310, third stage 315, and so on), a set of CRC bits may be appended to CBs (e.g., CBs 325) at each stage, and subsequent stages may include the concatenation of CBs including appended CRC bits from a prior stage. After appending the CRC bits, the appended CRC bits and concatenated CBs 325 may form a codeword of a message that is transmitted to another device.

As an illustrative example, the CRC hierarchy 300 may be used for transmitting a codeword including CB 325-a, CB 325-*b*, CB 325-*c*, and CB 325-*d* and may include three stages (e.g., l=3): first stage 305, second stage 310, and third stage 315. During the first stage 305, the wireless device may append level 1 CRC bits 330-*a* (e.g., a number of CRC bits, $c_1$) to each CB 325. That is, each group of CBs in the first stage 305 may include a single CB 325 (e.g., $u_1=1$) and a number of appended CRC bits (e.g., level 1 CRC bits 330-*a* having a size $c_1$). In such cases, the respective CRC bits may be appended (e.g., added) to the end of each CB 325 (e.g., after a last bit of the CB 325).

During the second stage 310, the wireless device may concatenate the CBs 325 into a number of groups each having a number of CB, $u_2$, where in the example of FIG. 3, $u_2=2$. The wireless device may append level 2 CRC bits 330-*b* (e.g., a number of CRC bits, $c_2$) to each group of two CBs 325. For example, the wireless device may concatenate CB 325-*a* and CB 325-*b* and may add the level 2 CRC bits 330-*b* having a size of $c_2$ bits (e.g., to the end of CB 325-*b*, adding level 2 CRC bits 330-*b* after a last bit of the level 1 CRC bits 330-*a*). In some examples, the CRC bits may be added in a different order or appended to a different portion of CBs or concatenated CBs. For example, CRC bits may be appended to a beginning of a first CB or may be included between concatenated CBs. Likewise, the wireless device may concatenate CB 325-*c* and 325-*d* and may add the level 2 CRC bits 330-*b* having a size of ca bits (e.g., to the end of CB 325-*d*). That is, the wireless device may add level 2 CRC bits for every concatenation of $u_2=2$ to a last CB of the concatenation, where each group of CBs according to the second stage 310 may include two CBs 325 (e.g., $u_2=2$) each appended with the $c_1$ CRC bits and a last CB of the group additionally appended with the $c_2$ CRC bits (e.g., the stage 2 CRC bits 330-*b*).

During the third stage 315, the wireless device may concatenate the CBs 325 into a number of groups each having a number of CBs, $u_3$, where in the example of FIG. 3, $u_3=4$ such that, in this example, the final stage (e.g., the third stage 315) includes a single group of CBs. The wireless device may append level 3 CRC bits 330-*c* (e.g., a number of CRC bits, $c_3$) to the group of four CBs 325. For example, the wireless device may concatenate CB 325-*a* through CB 325-*d* and may add the level 3 CRC bits 330-*c* (e.g., the third stage CRC bits, $c_3$) having a size of $c_3$ bits (e.g., to the end of CB 325-*d*). That is, the wireless device may add level 3 CRC bits to the concatenation of $u_3=4$ CBs 325 to a last CB of the concatenation (e.g., CB 325-*d*), where each group of CBs according to the third stage 315 may include four CBs 325 (e.g., $u_3=4$) each appended with the $c_1$ CRC bits, two CBs each appended with the $c_2$ CRC bits, and a last CB of the group additionally appended with the $c_3$ CRC bits. As shown in the example of a concatenated group of CBs 320, each CB of the group of CBs 320 may include the CRC bits that are appended at the first stage 305, and some CBs of the group of CBs 320 my include additional CRC bits that are appended at subsequent stages (e.g., the second stage 310, the third stage 315, and so on).

In such a way, each CB 325 may be protected by an effective CRC length of $c_1+c_2+c_3$ bits, thus minimizing erroneous decoding misdetection and enabling efficient retransmission (e.g., retransmissions including only failed CBs). Additionally, the CRC overhead per CB is $$\frac{c1}{u1}+\frac{c2}{u2}+\frac{c3}{u3},$$

which may result in relatively smaller CRC overhead than some other CRC methods.

Errors in CB detection may result in a CRC error in one of the $c_1$ CRC bits enabling the wireless device to direct retransmission to the failed CB (e.g., may enable the wireless device to retransmit the CB associated with the $c_1$ CRC bit associated with the error) thus enabling a targeted retransmission of CBs without sacrificing retransmission efficiency. In some examples, the wireless device may not detect an error in any of the $c_1$ CRC bits but may detect an error in one of the $c_2$ CRC bits. In such examples, the wireless device may retransmit the group of $u_2$ CBs associated with the error. In some examples, the wireless device may not detect an error in any of the $c_1$ CRC bits or the $c_2$ CRC bits but may detect an error in one of the $c_3$ CRC bits. In such examples, the wireless device may retransmit the group of $u_3$ CBs associated with the error. In such a way, each CB is protected by a total of $c_1+c_2+c_3$ CRC bits where, in some examples, $c_1 \geq c_2 \geq c_3$, (or, e.g., $c_3 \geq c_2 \geq c_1$, or $c_2 \geq c_1 \geq c_3$, or $c_2 \geq c_3 \geq c_1$, or $c_1 \geq c_3 \geq c_2$, or $c_3 \geq c_1 \geq c_2$), and the likelihood of retransmitting a successfully decoded CB is minimized.

Although the CRC hierarchy 300 illustrates an example of a three-stage CRC hierarchy, any number of stages may be used when appending CRC bits to CBs in accordance with the techniques described herein.

Figure 4:
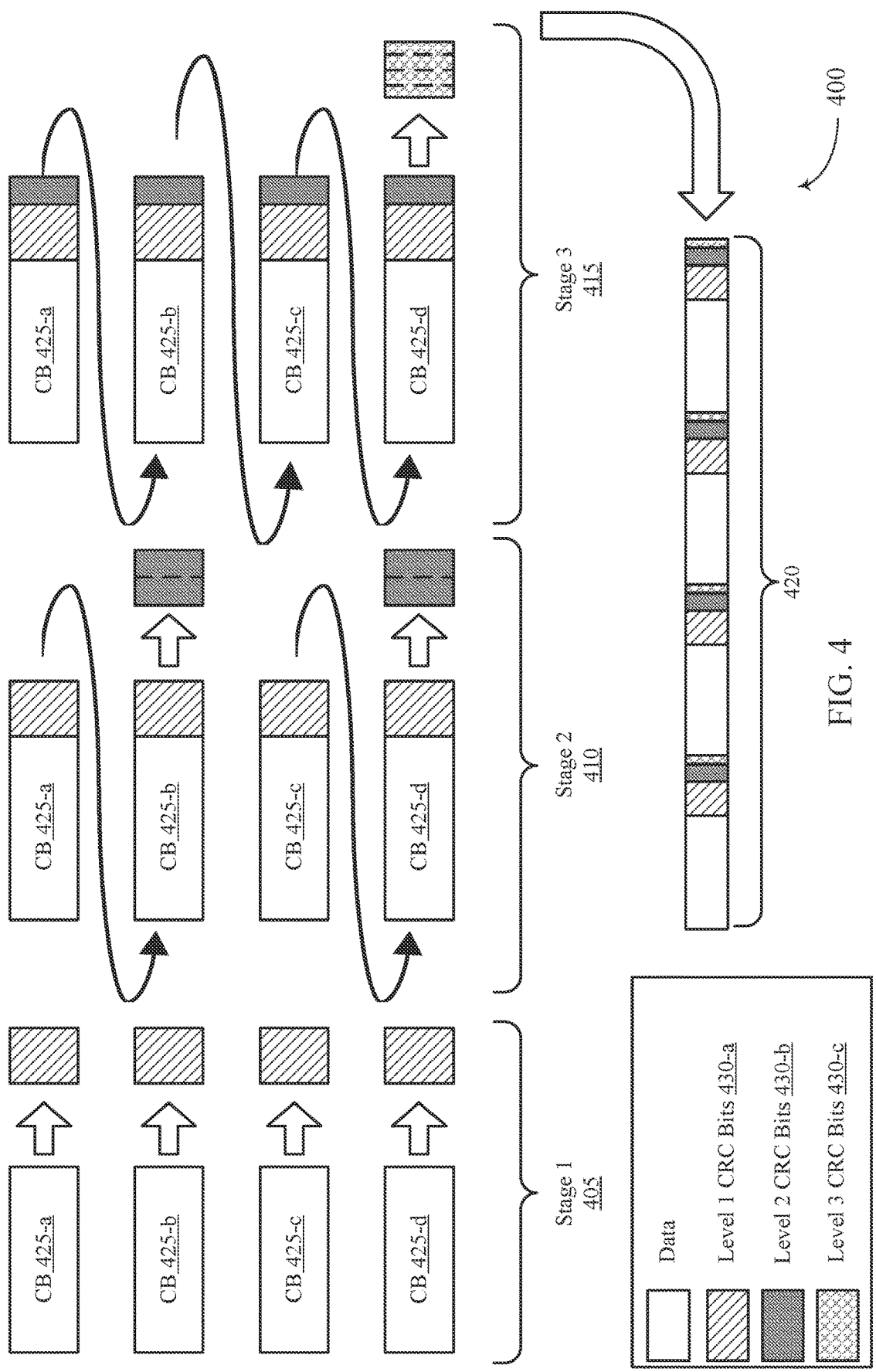

FIG. 4 illustrates an example of a CRC hierarchy 400 that supports hierarchical CRC techniques in accordance with aspects of the present disclosure. In some examples, the CRC hierarchy 400 may implement or be implemented by aspects of wireless communications system 100, for example, by a UE 115 and a base station 105 as described with reference to FIGS. 1 and 2.

As described herein, a wireless device may append (e.g., add) CRC bits to CBs using a hierarchical, distributed CRC scheme. For example, over two or more stages (e.g., first stage 405, second stage 410, third stage 415, and so on), a set of CRC bits may be appended to CBs (e.g., CBs 425) at each stage, and subsequent stages may include the concatenation of CBs including appended CRC bits from a prior stage. After appending the CRC bits, the appended CRC bits and concatenated CBs 425 may form a codeword of a message that is transmitted to another device.

As an example, the CRC hierarchy 400 may be applied to CB 425-*a*, CB 425-*b*, CB 425-*c*, and CB 425-*d* and may include 3 stages (e.g., 1.=3): first stage 405, second stage 410, and third stage 415. During the first stage 405, the wireless device may append level 1 CRC bits 430-*a* (e.g., a number of CRC bits, $c_1$) to each CB 425. That is, each group of CBs according to the first stage 405 may include a single CB 425 (e.g., $u_1=1$) and a number of appended CRC bits (e.g., level 1 CRC bits 430-*a* having a size $c_1$).

During the second stage 410, the wireless device may concatenate the CBs 425 into a number of groups each having a number of CBs 425, $u_2$, where in the example of FIG. 4, $u_2=2$. The wireless device may append level 2 CRC bits 430-*b* (e.g., a number of CRC bits, $c_2$) to each group of two CBs 425. For example, the wireless device may concatenate CB 425-*a* and 425-*b* and may distribute $c_2$ bits of the level 2 CRC bits 430-*b* (e.g., evenly or approximately evenly, such as in the case of an odd number of bits) to the CB 425-*a* and the CB 425-*b* such that each of CB 425-*a* and CB 425-*b* are appended with $$C1+\frac{c2}{2}$$

bits. Likewise, the wireless device may concatenate CB 425-*c* and 425-*d* and may distribute the level 2 CRC bits 430-*b* having a size of $c_2$ bits evenly to the CB 425-*c* and the CB 425-*d* such that each of CB 425-*c* and CB 425-*d* are appended with $$C1 + \frac{c2}{2}$$

bits. That is, me wireless device may distribute a number of level 2 CRC bits 430-*b* across each concatenation of $u_2=2$ CBs 425, where each group of CBs according to the second stage 410 may include two CBs 425 (e.g., $u_2=2$) each appended with the $c_1$ CRC bits and appended with the c2/u2 CRC bits. Accordingly, distributing the CRC bits as described herein, may minimize code block CRC overhead that may occur when appending CRC bits to a last CB of a concatenated group of CBs. That is, the distribution of CRC bits may avoid an un-equal partitioning of the CRC load among the CBs, where each CB of a group of CBs may have an approximately equal number of CRC bits, thereby enhancing the probability of error detection for the CBs while maintaining a relatively reduced CRC overhead.

During the third stage 415, the wireless device may concatenate the CBs 425 into a number of groups each having a number of CB $u_3$, where in the example of FIG. 4, $u_3=4$ such that, in this example, the final stage (e.g., third stage 415) includes a single group of CBs 425. The wireless device may append level 3 CRC bits 430-*c* (e.g., a number of CRC bits, $c_3$) to each group of four CBs 425. For example, the wireless device may concatenate CB 425-*a*, CB 425-*b*, CB 425-*c*, and CB 425-*d* and may distribute $c_3$ bits evenly to the CB 425-*a* CB 425-*b*, CB 425-*c*, and CB 425-*d* such that each of CB 425-*a*, CB 425-*b*, CB 425-*c*, and CB 425-*d* are appended with $$C1 + \frac{c2}{2} + \frac{c3}{4}$$

CRC bits, where in some cases, $c_1 \geq c_2 \geq c_3$, or vice versa. That is, the wireless device may distribute a number of level 3 CRC bits 430-*c* across the concatenation of $u_3=4$ CBs 425, where each group of CBs according to the third stage 415 may include four CBs 425 (e.g., $u_3=4$) each appended with the $c_1$ (e.g., $$\frac{c1}{u1 = 1}$$

) CRC bits, the c2/u2 CRC bits, and the c3/u3 CRC bits, as shown in the example of concatenated group of CBs 420, each CB of the group of CBs 420 may include the distributed CRC bits.

In such examples, each CB 425 is appended with a same number of CRC bits minimizing any imbalance of CRC overhead (e.g., one CB being appended with more or fewer CRC bits than another). In some examples, splitting the CRC bits from each stage may be done partially, to minimize imbalance between CB CRC overhead.

In some examples, aspects of the disclosure as described with reference FIG. 3 may be implemented in conjunction with aspects of the disclosure described with reference to FIG. 4. That is, a base station may append CRC bits to a last CB of a concatenated group during one stage and may distribute CRC bits to each CB of a concatenated group during another stage.

Figure 5:
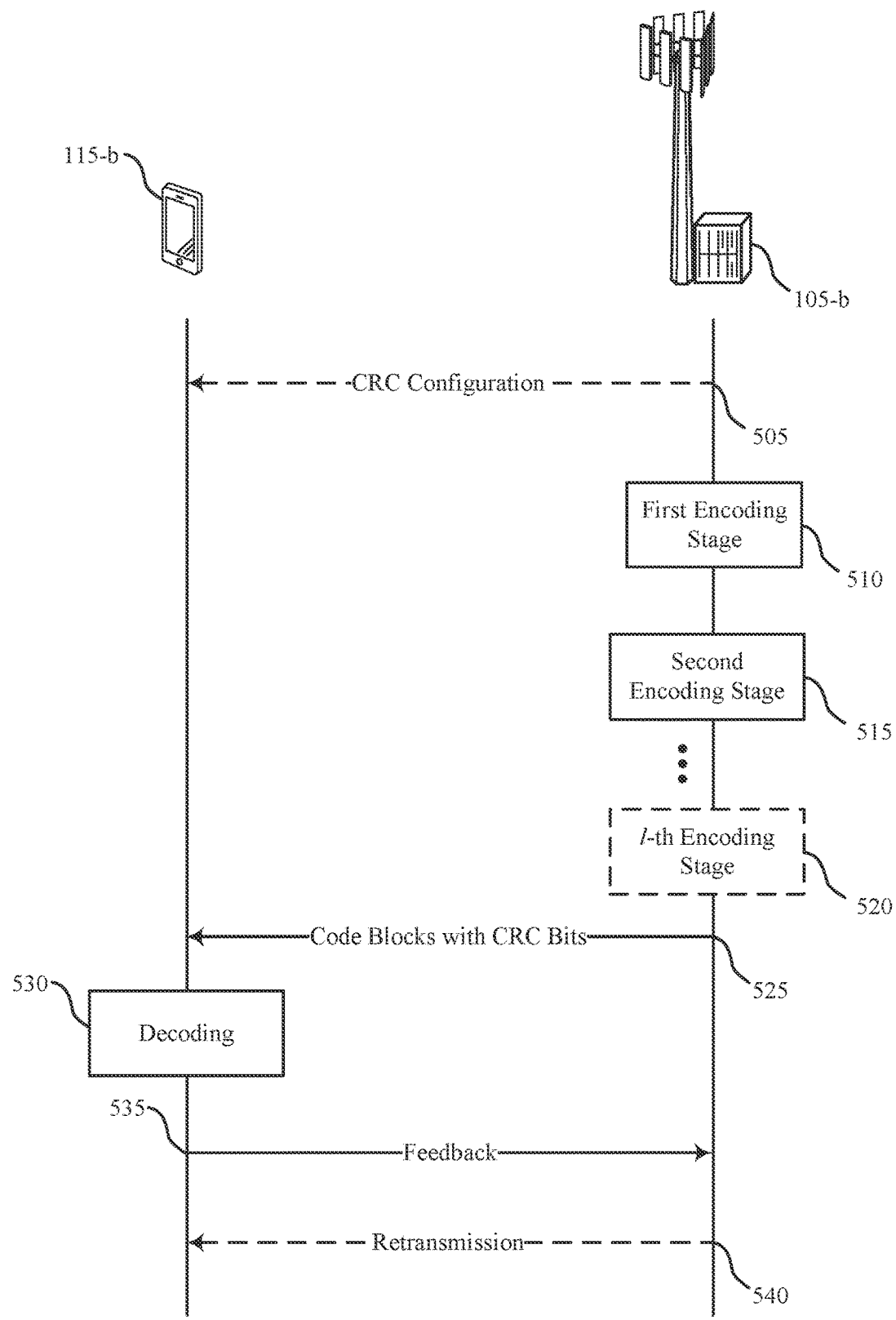
FIG. 5 illustrates an example of a process flow in a system that supports hierarchical CRC techniques in accordance with aspects of the present disclosure.

FIG. 5 illustrates an example of a process flow 500 that supports hierarchical CRC techniques in accordance with aspects of the present disclosure. The process flow 500 may implement or be implemented by aspects of wireless communications system 100. For example, the process flow 500 may illustrate operations between a UE 115-*b* and a base station 105-*b*, which may be examples of a UE 115 and a base station 105, as described with reference to FIG. 1. In the following description of the process flow 500, the operations between the UE 115-*b* and the base station 105-*b* may be transmitted in a different order than the example order shown, or the operations performed by the UE 115-*b* and the base station 105-*b* may be performed in different orders or at different times. Some operations may also be omitted from the process flow 500, and other operations may be added to the process flow 500.

Optionally, at 505, the base station 105-*b* may transmit a CRC configuration to the UE 115-*a* for transmitting a set of CBs including CRC bits to the UE 115-*b*. For example, the CRC configuration may indicate how many stages (e.g., l) in which the base station will encode the CBs. The CRC configuration may also indicate whether the CRC bits appended during each stage will be appended to a single (e.g., last) CB of a concatenated group (e.g., as described with reference to FIG. 3) or will be distributed and appended to each CB of a concatenated group evenly (e.g., as described with reference to FIG. 4). In some examples, the CRC configuration may indicate a first vector of CRC bits for each stage of the l-stage CRC hierarchy and a second vector of CB groups for each stage of the l-stage CRC hierarchy.

In some examples, the CRC configuration may be selected from pre-defined list configured at a network entity, or selection may be performed semi-statically based on: channel type, CB (or code block group) size. In some examples, selection may be done dynamically based on an expected probability of error in a current re-transmission or a pre-defined rule may link the selected CRC configuration and the expected probability of error. In some examples, the expected probability of error may be derived at both the UE 115-*b* and the base station 105-*b* for MIRS or for other purposes and may also be used for CRC configuration selection. In some examples, signaling of physical downlink control channel (PDCCH) CRC may be transmitted in downlink control information (DCI) for dynamic selection or may be transmitted in a MAC-control element (CE) or RRC signaling.

At 510, the base station 105-*b* may perform one or more operations as part of a first encoding stage. In some examples, the base station 105-*b* may append a first set of CRC bits (e.g., a number of CRC bits, $c_1$) to each CB of the set. That is, each group of CBs according to the first stage may include a single CB (e.g., $u_1=1$) appended with number of CRC bits (e.g., $c_1$).

At 515, the base station 105-*b* may perform one or more operations as part of a second encoding stage. For example, the base station 105-*b* may concatenate the CBs of the set into a first number of groups each having a number of CBs $u_2$. In some examples, the base station may append a second set of CRC bits (e.g., a number of CRC bits, $c_2$) to a last CB of each group of concatenated CBs. That is, the base station may add the second set of CRC bits to a last CB of each concatenation, where each group of CBs according to the second stage may include $u_2$ CBs each appended with the first set of CRC bits and a last CB of the group additionally appended with the second set of CRC bits. In some other examples, the base station 105-*b* may distribute and append the second set of CRC bits to each group of the first number of groups (e.g., to each CB of each group). For example, the base station 105-*b* may distribute $c_2$ bits evenly to the CBs of each group of the first number of groups such that each CB of a group is appended with $$C1 + \frac{c2}{u2}$$

bits. That is, the base station 105-*b* may distribute the second set of CRC bits across each concatenation of $u_2$ CBs, where each group of CBs according to the second stage may include $u_2$ CBs each appended with the first set of CRC bits and also appended with the c2/u2 CRC bits.

In some other examples, the base station 105-*b* may concatenate the CBs into a number of groups each having a number of CBs, $u_2$, where in the example of FIG. 4, $u_2=2$. The base station may append level 2 CRC bits (e.g., a number of CRC bits, $c_2$) to each group of two CBs 425. For example, the base station may concatenate CB 425-*a* and 425-*b* and may distribute $c_2$ bits evenly to the CB 425-*a* and the CB 425-*b* such that each of CB 425-*a* and CB 425-*b* are appended with $$C1 + \frac{c2}{2}$$

bits. Likewise, the base station may concatenate CB 425-*c* and 425-*d* and may distribute $c_2$ bits evenly to the CB 425-*c* and the CB 425-*d* such that each of CB 425-*c* and CB 425-*d* are appended with $$C1 + \frac{c2}{2}$$

bits. That is, the base station may distribute a number of level 2 CRC bits across each concatenation of $u_2=2$ CBs, where each group of CBs according to the second stage 410 may include two CBs 425 (e.g., $u_2=2$) each appended with the $c_1$ CRC bits and appended with the c2/u2 CRC bits.

At 520, the base station 105-*b* may perform one or more operations as part of an l-th encoding stage. For example, the base station may concatenate the first number of groups from the (l−1)-th encoding stage into a second number of groups each having a number of CBs, $u_l$, where in some cases, the l-th stage includes a single group of all the CBs of the set. In some examples, the base station 105-*b* may append an l-th set of CRC bits (e.g., a number of CRC bits, $c_l$) to each of the second number of groups of $u_l$ CBs. That is, the base station may add the l-th set of CRC bits to a last CB of each concatenation of $u_l$ CBs, where each group of CBs according to the l-th stage may include $u_l$ CBs each appended with the first set of CRC bits, a number of CBs equal to the number of groups in the first set of groups (e.g., the last CBs in each of the first set of groups) each appended with the second set of CRC bits, and so forth, until a last CB of the group is appended with the l-th set of CRC bits.

In some other examples, the base station 105-*b* may evenly distribute and append the l-th set of CRC bits (e.g., a number of CRC bits, $c_l$) to each group of the second number of groups. For example, the base station may concatenate the CBs of each group of the second number of groups such that each of the CBs is appended with $$C1 + \frac{c2}{u2} + \ldots + \frac{cl}{ul}$$

CRC bits. That is, me base station may distribute the l-th set of CRC bits across the concatenation of $u_l$ CBs, where each group of CBs according to the l-th stage may include $u_l$ CBs each appended with the $$C1 \left( e.g., \frac{c1}{u1 = 1} \right)$$

CRC bits, the c2/u2 CRC bits, . . . and the cl/ul CRC bits.

At 525, the base station 105-*b* may transmit the CBs including the CRC bits appended to the CBs according to the first stage, the second stage, and so on, through the l-th stage.

At 530, the UE 115-*b* may attempt to decode the received CBs. In some examples, the UE 115-*b* may attempt to decode the CBs according to the received CRC configuration. At 535, the UE 115-*b* may transmit feedback to the base station 105-*b* based on whether one or more of the received CRCs (e.g., and the associated CB or group of CBs) was associated with an error. That is, the UE may transmit feedback to the base station 105-*b* including feedback that is based on whether one or more of the received CRCs was associated with an error. For example, the UE 115-*b* may transmit a positive acknowledgement if none of the CRCs are associated with an error. Additionally or alternatively, the UE 115-*b* may transmit a negative acknowledgement if one or more of the received CRCs are associated with an error. In some aspects, the feedback transmitted by the UE 115-*b* may include feedback information for a single CB of the group of CBs (e.g., that was not decoded based on a CRC error). In other examples, the feedback transmitted by the UE 115-*b* may include feedback information for a multiple CBs of the group of CBs (e.g., that were not decoded based on a CRC error).

At 540, the base station 105-*b* may retransmit one or more of the CBs based on in which stage the CRC bit associated with the error was appended. For example, the base station 105-*b* may retransmit a single CB if the CRC bit associated with the error was appended during the first stage, may retransmit an associated group (e.g., including concatenated CBs) of the first number of groups if the CRC bit associated with the error was appended during the second stage, and so on.

Figure 6:
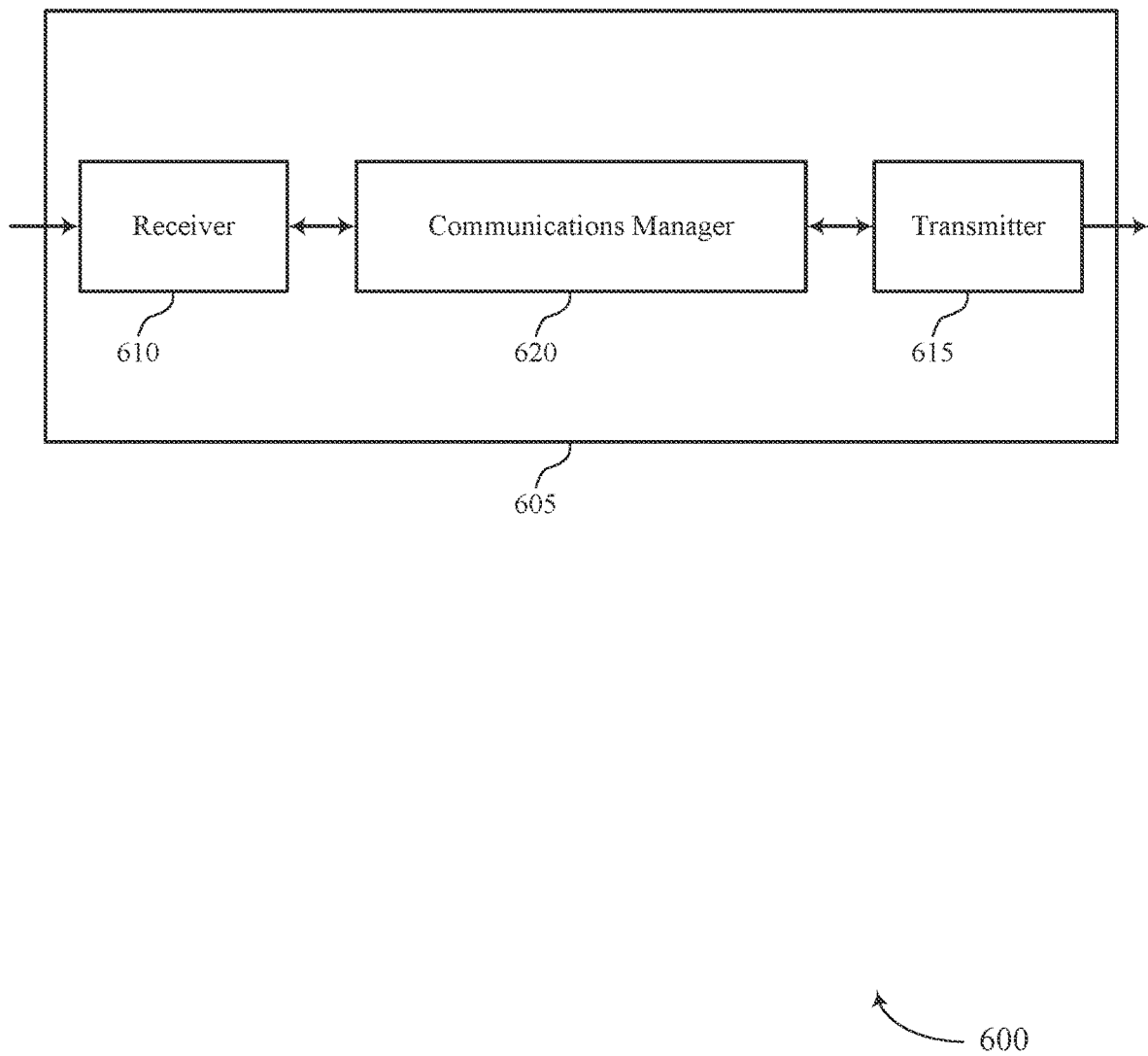
FIGS. 6 and 7 show block diagrams of devices that support hierarchical CRC techniques in accordance with aspects of the present disclosure.

FIG. 6 shows a block diagram 600 of a device 605 that supports hierarchical CRC techniques in accordance with aspects of the present disclosure. The device 605 may be an example of aspects of a base station 105 as described herein. The device 605 may include a receiver 610, a transmitter 615, and a communications manager 620. The device 605 may also include a processor. Each of these components may be in communication with one another (e.g., via one or more buses).

The receiver 610 may provide a means for receiving information such as packets, user data, control information, or any combination thereof associated with various information channels (e.g., control channels, data channels, information channels related to hierarchical CRC). Information may be passed on to other components of the device 605. The receiver 610 may utilize a single antenna or a set of multiple antennas.

The transmitter 615 may provide a means for transmitting signals generated by other components of the device 605. For example, the transmitter 615 may transmit information such as packets, user data, control information, or any combination thereof associated with various information channels (e.g., control channels, data channels, information channels related to hierarchical CRC). In some examples, the transmitter 615 may be co-located with a receiver 610 in a transceiver module. The transmitter 615 may utilize a single antenna or a set of multiple antennas.

The communications manager 620, the receiver 610, the transmitter 615, or various combinations thereof or various components thereof may be examples of means for performing various aspects of hierarchical CRC as described herein. For example, the communications manager 620, the receiver 610, the transmitter 615, or various combinations or components thereof may support a method for performing one or more of the functions described herein.

In some examples, the communications manager 620, the receiver 610, the transmitter 615, or various combinations or components thereof may be implemented in hardware (e.g., in communications management circuitry). The hardware may include a processor, a digital signal processor (DSP), an application-specific integrated circuit (ASIC), a field-programmable gate array (FPGA) or other programmable logic device, a discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally or alternatively, in some examples, the communications manager 620, the receiver 610, the transmitter 615, or various combinations or components thereof may be implemented in code (e.g., as communications management software or firmware) executed by a processor. If implemented in code executed by a processor, the functions of the communications manager 620, the receiver 610, the transmitter 615, or various combinations or components thereof may be performed by a general-purpose processor, a DSP, a CPU, an ASIC, an FPGA, or any combination of these or other programmable logic devices (e.g., configured as or otherwise supporting a means for performing the functions described in the present disclosure).

In some examples, the communications manager 620 may be configured to perform various operations (e.g., receiving, monitoring, transmitting) using or otherwise in cooperation with the receiver 610, the transmitter 615, or both. For example, the communications manager 620 may receive information from the receiver 610, send information to the transmitter 615, or be integrated in combination with the receiver 610, the transmitter 615, or both to receive information, transmit information, or perform various other operations as described herein.

The communications manager 620 may support wireless communication in accordance with examples as disclosed herein. For example, the communications manager 620 may be configured as or otherwise support a means for appending, during a first encoding stage, a first set of CRC bits having a first size to each CB of a set of multiple CBs. The communications manager 620 may be configured as or otherwise support a means for concatenating two or more CBs from the set of multiple CBs into a first set of CBs, each CB of the two or more CBs including the appended first set of CRC bits. The communications manager 620 may be configured as or otherwise support a means for appending, during a second encoding stage, a second set of CRC bits having a second size to the first set of CBs. The communications manager 620 may be configured as or otherwise support a means for transmitting a message including the set of multiple CBs including the appended first set of CRC bits and the appended second set of CRC bits.

By including or configuring the communications manager 620 in accordance with examples as described herein, the device 605 (e.g., a processor controlling or otherwise coupled to the receiver 610, the transmitter 615, the communications manager 620, or a combination thereof) may support techniques for higher reliability and more efficient utilization of communication resources.

Figure 7:
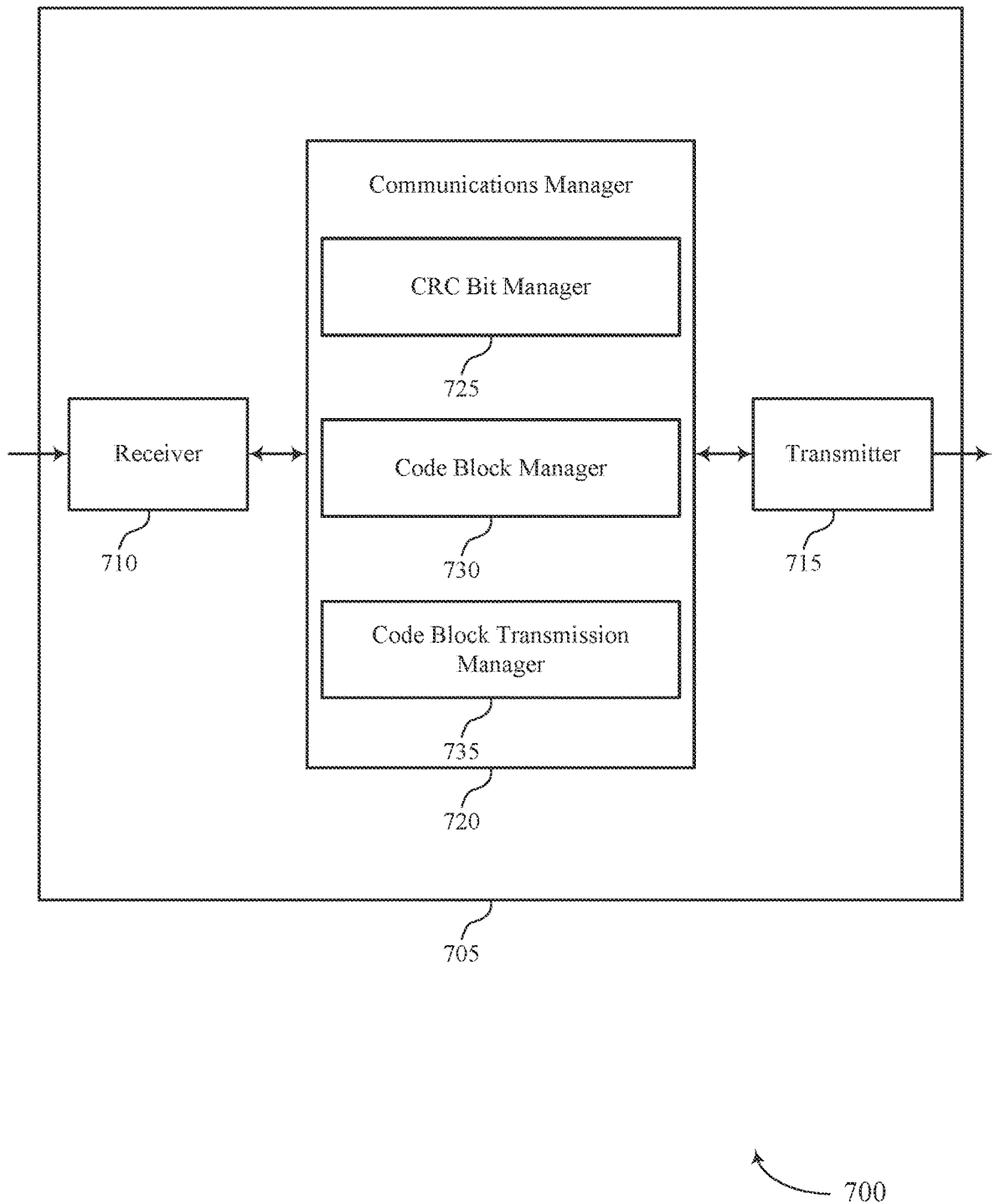

FIG. 7 shows a block diagram 700 of a device 705 that supports hierarchical CRC techniques in accordance with aspects of the present disclosure. The device 705 may be an example of aspects of a device 605 or a base station 105 as described herein. The device 705 may include a receiver 710, a transmitter 715, and a communications manager 720. The device 705 may also include a processor. Each of these components may be in communication with one another (e.g., via one or more buses).

The receiver 710 may provide a means for receiving information such as packets, user data, control information, or any combination thereof associated with various information channels (e.g., control channels, data channels, information channels related to hierarchical CRC). Information may be passed on to other components of the device 705. The receiver 710 may utilize a single antenna or a set of multiple antennas.

The transmitter 715 may provide a means for transmitting signals generated by other components of the device 705. For example, the transmitter 715 may transmit information such as packets, user data, control information, or any combination thereof associated with various information channels (e.g., control channels, data channels, information channels related to hierarchical CRC). In some examples, the transmitter 715 may be co-located with a receiver 710 in a transceiver module. The transmitter 715 may utilize a single antenna or a set of multiple antennas.

The device 705, or various components thereof, may be an example of means for performing various aspects of hierarchical CRC as described herein. For example, the communications manager 720 may include an CRC bit manager 725, a CB manager 730, a CB transmission manager 735, or any combination thereof. The communications manager 720 may be an example of aspects of a communications manager 620 as described herein. In some examples, the communications manager 720, or various components thereof, may be configured to perform various operations (e.g., receiving, monitoring, transmitting) using or otherwise in cooperation with the receiver 710, the transmitter 715, or both. For example, the communications manager 720 may receive information from the receiver 710, send information to the transmitter 715, or be integrated in combination with the receiver 710, the transmitter 715, or both to receive information, transmit information, or perform various other operations as described herein.

The communications manager 720 may support wireless communication in accordance with examples as disclosed herein. The CRC bit manager 725 may be configured as or otherwise support a means for appending, during a first encoding stage, a first set of CRC bits having a first size to each CB of a set of multiple CBs. The CB manager 730 may be configured as or otherwise support a means for concatenating two or more CBs from the set of multiple CBs into a first set of CBs, each CB of the two or more CBs including the appended first set of CRC bits. The CRC bit manager 725 may be configured as or otherwise support a means for appending, during a second encoding stage, a second set of CRC bits having a second size to the first set of CBs. The CB transmission manager 735 may be configured as or otherwise support a means for transmitting a message including the set of multiple CBs including the appended first set of CRC bits and the appended second set of CRC bits.

Figure 8:
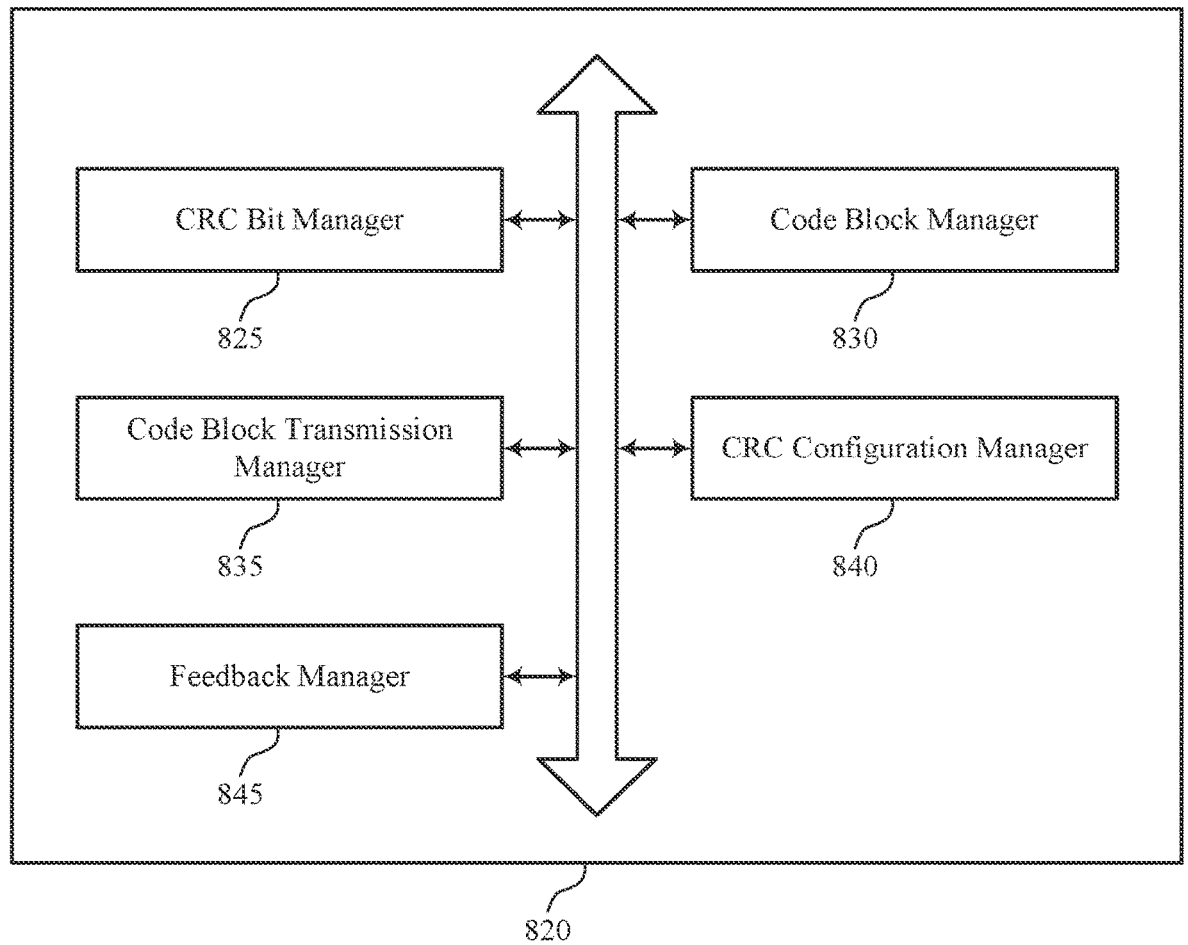
FIG. 8 shows a block diagram of a communications manager that supports hierarchical CRC techniques in accordance with aspects of the present disclosure.

FIG. 8 shows a block diagram 800 of a communications manager 820 that supports hierarchical CRC techniques in accordance with aspects of the present disclosure. The communications manager 820 may be an example of aspects of a communications manager 620, a communications manager 720, or both, as described herein. The communications manager 820, or various components thereof, may be an example of means for performing various aspects of hierarchical CRC as described herein. For example, the communications manager 820 may include an CRC bit manager 825, a CB manager 830, a CB transmission manager 835, an CRC configuration manager 840, a feedback manager 845, or any combination thereof. Each of these components may communicate, directly or indirectly, with one another (e.g., via one or more buses).

The communications manager 820 may support wireless communication in accordance with examples as disclosed herein. The CRC bit manager 825 may be configured as or otherwise support a means for appending, during a first encoding stage, a first set of CRC bits having a first size to each CB of a set of multiple CBs. The CB manager 830 may be configured as or otherwise support a means for concatenating two or more CBs from the set of multiple CBs into a first set of CBs, each CB of the two or more CBs including the appended first set of CRC bits. In some examples, the CRC bit manager 825 may be configured as or otherwise support a means for appending, during a second encoding stage, a second set of CRC bits having a second size to the first set of CBs. The CB transmission manager 835 may be configured as or otherwise support a means for transmitting a message including the set of multiple CBs including the appended first set of CRC bits and the appended second set of CRC bits.

In some examples, the CRC bit manager 825 may be configured as or otherwise support a means for distributing the second set of CRC bits to each CB of the two or more CBs, where a first CB of the two or more CBs is appended with a first portion of the second set of CRC bits and a second CB of the two or more CBs is appended with a second portion of the second set of CRC bits.

In some examples, the CB manager 830 may be configured as or otherwise support a means for concatenating the first set of CBs and a second set of CBs into a third set of CBs, the second set of CBs including two or more additional CBs from the set of multiple CBs that each includes the appended first set of CRC bits, where the second set of CBs is appended with the second set of CRC bits. In some examples, the CRC bit manager 825 may be configured as or otherwise support a means for appending, during a third encoding stage, a third set of CRC bits having a third size to the concatenated first set of CBs and second set of CBs, where the message includes the set of multiple CBs including the appended first set of CRC bits, the appended second set of CRC bits, and the appended third set of CRC bits.

In some examples, the CB manager 830 may be configured as or otherwise support a means for distributing the third set of CRC bits to the first set of CBs and the second set of CBs, where the first set of CBs is appended with a first portion of the third set of CRC bits and the second set of CBs is appended with a second portion of the third set of CRC bits.

In some examples, the CRC configuration manager 840 may be configured as or otherwise support a means for transmitting a second message indicating a CRC configuration, where appending the first set of CRC bits, concatenating the two or more CBs, and appending the second set of CRC bits is based on the CRC configuration.

In some examples, the second message is transmitted via MAC-CE signaling, DCI, RRC signaling, or any combination thereof.

In some examples, the first encoding stage and the second encoding stage are from a set of multiple encoding stages for encoding the message, each encoding stage of the set of multiple encoding stages being associated with appending respective sets of CRC bits to one or more CBs of the set of multiple CBs.

In some examples, the CRC configuration manager 840 may be configured as or otherwise support a means for determining a set of CRC bits corresponding to respective encoding stages and one or more polynomial functions associated with the set of CRC bits. In some examples, the CB manager 830 may be configured as or otherwise support a means for determining a number of the set of multiple CBs corresponding to the respective encoding stages, where appending the first set of CRC bits, concatenating the two or more CBs, and appending the second set of CRC bits is based on the set of CRC bits, the one or more polynomial functions, the number of the set of multiple CBs, and the respective encoding stages.

In some examples, the feedback manager 845 may be configured as or otherwise support a means for receiving a feedback message in response to the transmitted message. In some examples, the CB transmission manager 835 may be configured as or otherwise support a means for retransmitting one or more CBs from the set of multiple CBs based on the feedback message indicating a decoding failure associated with the one or more CBs including the appended first set of CRC bits having the first size or a decoding failure associated with the first set of CBs including the appended second set of CRC bits having the second size.

In some examples, to support retransmitting the one or more CBs from the set of multiple CBs, the CB transmission manager 835 may be configured as or otherwise support a means for retransmitting a single CB based on the feedback message indicating the decoding failure associated with the one or more CBs including the appended first set of CRC bits having the first size.

In some examples, to support retransmitting the one or more CBs from the set of multiple CBs, the CB transmission manager 835 may be configured as or otherwise support a means for retransmitting the first set of CBs based on the feedback message indicating the decoding failure associated with the first set of CBs including the appended second set of CRC bits having the second size.

In some examples, the CRC configuration manager 840 may be configured as or otherwise support a means for selecting a CRC encoding scheme from a set of multiple CRC encoding schemes, where appending the first set of CRC bits, concatenating the two or more CBs, and appending the second set of CRC bits is based on the CRC encoding scheme.

In some examples, the CRC encoding scheme indicates whether the second set of CRC bits are appended to a last CB of the first set of CBs or distributed to each CB of the first set of CBs.

In some examples, the CRC encoding scheme is selected from a preconfigured list of CRC encoding schemes.

In some examples, the CRC encoding scheme is semi-statically selected based on a channel type for transmitting the message, a size of respective CBs from the set of multiple CBs, or a size of CB groups, or any combination thereof.

In some examples, the CRC encoding scheme is dynamically selected based on an error probability associated with transmitting the message.

In some examples, a total number of CRC bits of the message includes a sum of the first set of CRC bits and the second set of CRC bits.

In some examples, the second set of CRC bits are appended to a temporally last CB of the first set of CBs based on concatenating the two or more CBs.

Figure 9:
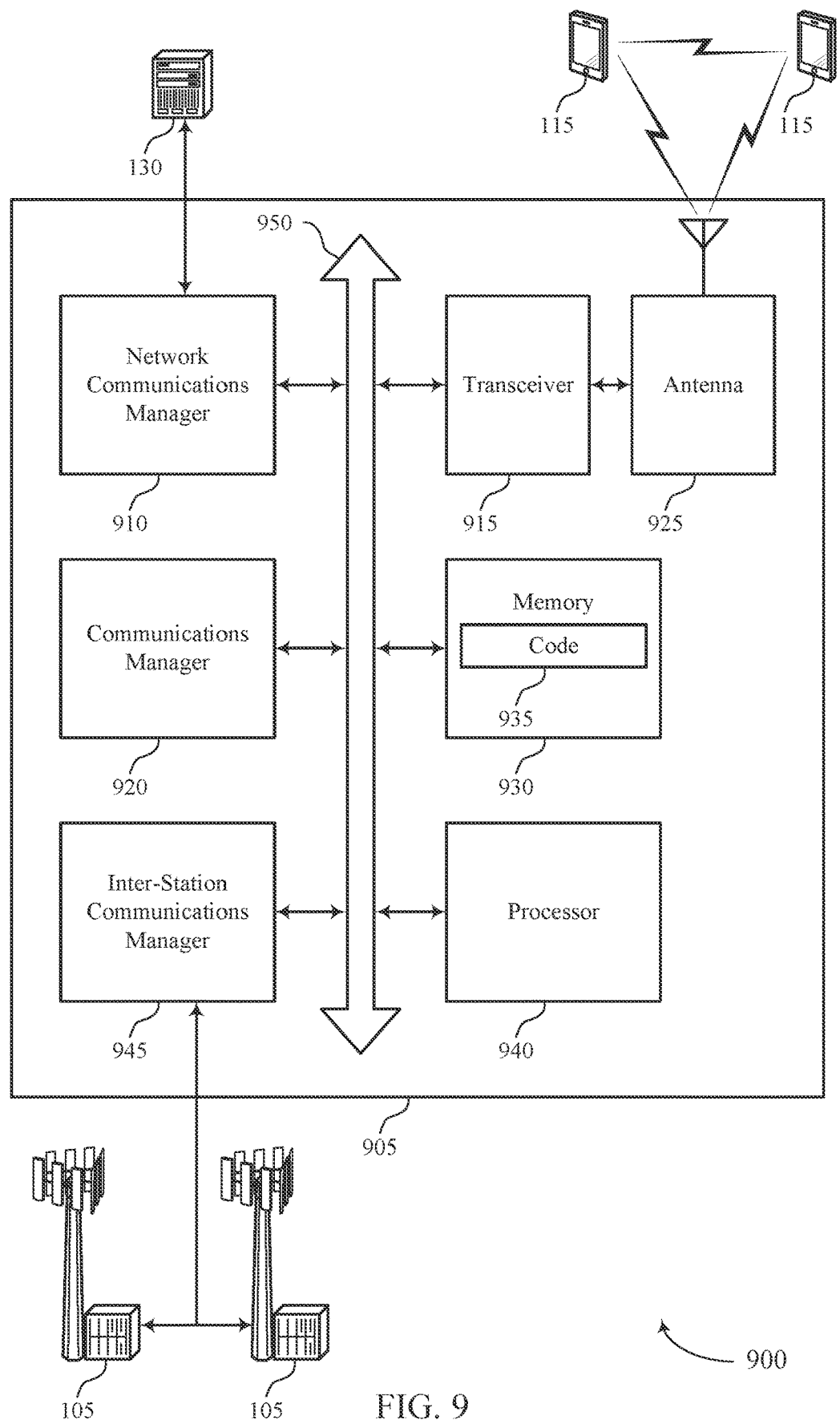
FIG. 9 shows a diagram of a system including a device that supports hierarchical CRC techniques in accordance with aspects of the present disclosure.

FIG. 9 shows a diagram of a system 900 including a device 905 that supports hierarchical CRC techniques in accordance with aspects of the present disclosure. The device 905 may be an example of or include the components of a device 605, a device 705, or a base station 105 as described herein. The device 905 may communicate wirelessly with one or more base stations 105, UEs 115, or any combination thereof. The device 905 may include components for bi-directional voice and data communications including components for transmitting and receiving communications, such as a communications manager 920, a network communications manager 910, a transceiver 915, an antenna 925, a memory 930, code 935, a processor 940, and an inter-station communications manager 945. These components may be in electronic communication or otherwise coupled (e.g., operatively, communicatively, functionally, electronically, electrically) via one or more buses (e.g., a bus 950).

The network communications manager 910 may manage communications with a core network 130 (e.g., via one or more wired backhaul links). For example, the network communications manager 910 may manage the transfer of data communications for client devices, such as one or more UEs 115.

In some cases, the device 905 may include a single antenna 925. However, in some other cases the device 905 may have more than one antenna 925, which may be capable of concurrently transmitting or receiving multiple wireless transmissions. The transceiver 915 may communicate bi-directionally, via the one or more antennas 925, wired, or wireless links as described herein. For example, the transceiver 915 may represent a wireless transceiver and may communicate bi-directionally with another wireless transceiver. The transceiver 915 may also include a modem to modulate the packets, to provide the modulated packets to one or more antennas 925 for transmission, and to demodulate packets received from the one or more antennas 925. The transceiver 915, or the transceiver 915 and one or more antennas 925, may be an example of a transmitter 615, a transmitter 715, a receiver 610, a receiver 710, or any combination thereof or component thereof, as described herein.

The memory 930 may include random access memory (RAM) and read-only memory (ROM). The memory 930 may store computer-readable, computer-executable code 935 including instructions that, when executed by the processor 940, cause the device 905 to perform various functions described herein. The code 935 may be stored in a non-transitory computer-readable medium such as system memory or another type of memory. In some cases, the code 935 may not be directly executable by the processor 940 but may cause a computer (e.g., when compiled and executed) to perform functions described herein. In some cases, the memory 930 may contain, among other things, a basic input/output system (BIOS), which may control basic hardware or software operation such as the interaction with peripheral components or devices.

The processor 940 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 940 may be configured to operate a memory array using a memory controller. In some other cases, a memory controller may be integrated into the processor 940. The processor 940 may be configured to execute computer-readable instructions stored in a memory (e.g., the memory 930) to cause the device 905 to perform various functions (e.g., functions or tasks supporting hierarchical CRC). For example, the device 905 or a component of the device 905 may include a processor 940 and memory 930 coupled to the processor 940, the processor 940 and memory 930 configured to perform various functions described herein.

The inter-station communications manager 945 may manage communications with other base stations 105, and may include a controller or scheduler for controlling communications with UEs 115 in cooperation with other base stations 105. For example, the inter-station communications manager 945 may coordinate scheduling for transmissions to UEs 115 for various interference mitigation techniques such as beamforming or joint transmission. In some examples, the inter-station communications manager 945 may provide an X2 interface within an LTE/LTE-A wireless communications network technology to provide communication between base stations 105.

The communications manager 920 may support wireless communication in accordance with examples as disclosed herein. For example, the communications manager 920 may be configured as or otherwise support a means for appending, during a first encoding stage, a first set of CRC bits having a first size to each CB of a set of multiple CBs. The communications manager 920 may be configured as or otherwise support a means for concatenating two or more CBs from the set of multiple CBs into a first set of CBs, each CB of the two or more CBs including the appended first set of CRC bits. The communications manager 920 may be configured as or otherwise support a means for appending, during a second encoding stage, a second set of CRC bits having a second size to the first set of CBs. The communications manager 920 may be configured as or otherwise support a means for transmitting a message including the set of multiple CBs including the appended first set of CRC bits and the appended second set of CRC bits.

By including or configuring the communications manager 920 in accordance with examples as described herein, the device 905 may support techniques for improved communication reliability, reduced latency, improved user experience related to reduced processing, reduced power consumption, more efficient utilization of communication resources, and improved coordination between devices.

In some examples, the communications manager 920 may be configured to perform various operations (e.g., receiving, monitoring, transmitting) using or otherwise in cooperation with the transceiver 915, the one or more antennas 925, or any combination thereof. Although the communications manager 920 is illustrated as a separate component, in some examples, one or more functions described with reference to the communications manager 920 may be supported by or performed by the processor 940, the memory 930, the code 935, or any combination thereof. For example, the code 935 may include instructions executable by the processor 940 to cause the device 905 to perform various aspects of hierarchical CRC as described herein, or the processor 940 and the memory 930 may be otherwise configured to perform or support such operations.

Figure 10:
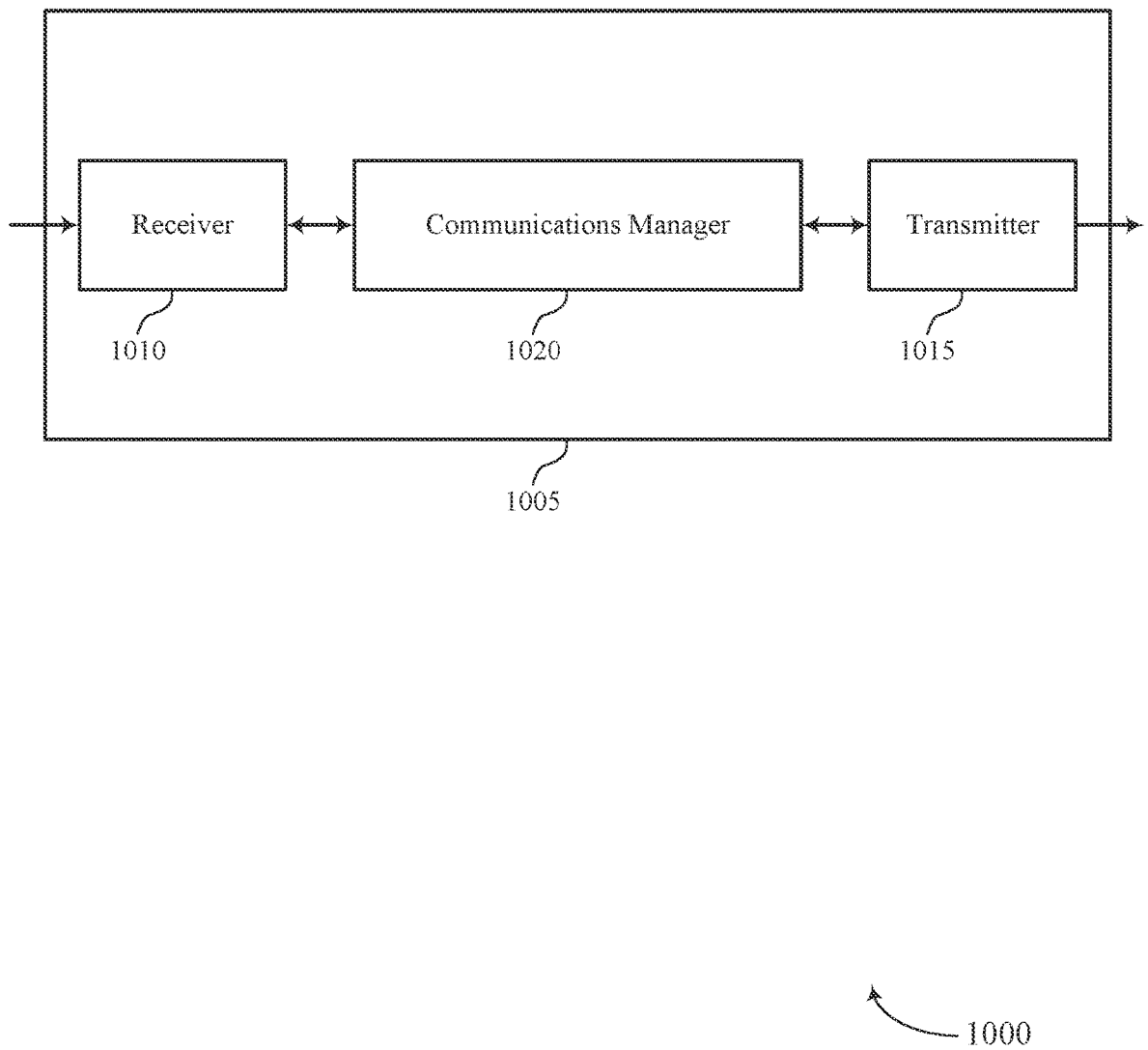
FIGS. 10 and 11 show block diagrams of devices that support hierarchical CRC techniques in accordance with aspects of the present disclosure.

FIG. 10 shows a block diagram 1000 of a device 1005 that supports hierarchical CRC techniques in accordance with aspects of the present disclosure. The device 1005 may be an example of aspects of a UE 115 as described herein. The device 1005 may include a receiver 1010, a transmitter 1015, and a communications manager 1020. The device 1005 may also include a processor. Each of these components may be in communication with one another (e.g., via one or more buses).

The receiver 1010 may provide a means for receiving information such as packets, user data, control information, or any combination thereof associated with various information channels (e.g., control channels, data channels, information channels related to hierarchical CRC). Information may be passed on to other components of the device 1005. The receiver 1010 may utilize a single antenna or a set of multiple antennas.

The transmitter 1015 may provide a means for transmitting signals generated by other components of the device 1005. For example, the transmitter 1015 may transmit information such as packets, user data, control information, or any combination thereof associated with various information channels (e.g., control channels, data channels, information channels related to hierarchical CRC). In some examples, the transmitter 1015 may be co-located with a receiver 1010 in a transceiver module. The transmitter 1015 may utilize a single antenna or a set of multiple antennas.

The communications manager 1020, the receiver 1010, the transmitter 1015, or various combinations thereof or various components thereof may be examples of means for performing various aspects of hierarchical CRC as described herein. For example, the communications manager 1020, the receiver 1010, the transmitter 1015, or various combinations or components thereof may support a method for performing one or more of the functions described herein.

In some examples, the communications manager 1020, the receiver 1010, the transmitter 1015, or various combinations or components thereof may be implemented in hardware (e.g., in communications management circuitry). The hardware may include a processor, a DSP, an ASIC, an FPGA or other programmable logic device, a discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally or alternatively, in some examples, the communications manager 1020, the receiver 1010, the transmitter 1015, or various combinations or components thereof may be implemented in code (e.g., as communications management software or firmware) executed by a processor. If implemented in code executed by a processor, the functions of the communications manager 1020, the receiver 1010, the transmitter 1015, or various combinations or components thereof may be performed by a general-purpose processor, a DSP, a central processing unit (CPU), an ASIC, an FPGA, or any combination of these or other programmable logic devices (e.g., configured as or otherwise supporting a means for performing the functions described in the present disclosure).

In some examples, the communications manager 1020 may be configured to perform various operations (e.g., receiving, monitoring, transmitting) using or otherwise in cooperation with the receiver 1010, the transmitter 1015, or both. For example, the communications manager 1020 may receive information from the receiver 1010, send information to the transmitter 1015, or be integrated in combination with the receiver 1010, the transmitter 1015, or both to receive information, transmit information, or perform various other operations as described herein.

The communications manager 1020 may support wireless communication in accordance with examples as disclosed herein. For example, the communications manager 1020 may be configured as or otherwise support a means for receiving a message including a set of multiple CBs, where each CB of the set of multiple CBs is appended with a first set of CRC bits having a first size, and where two or more concatenated CBs of the set of multiple CBs are appended with a second set of CRC bits having a second size. The communications manager 1020 may be configured as or otherwise support a means for attempting to decode the plurality of CBs based at least in part on receiving the message.

By including or configuring the communications manager 1020 in accordance with examples as described herein, the device 1005 (e.g., a processor controlling or otherwise coupled to the receiver 1010, the transmitter 1015, the communications manager 1020, or a combination thereof) may support techniques for reduced processing and more efficient utilization of communication resources.

Figure 11:
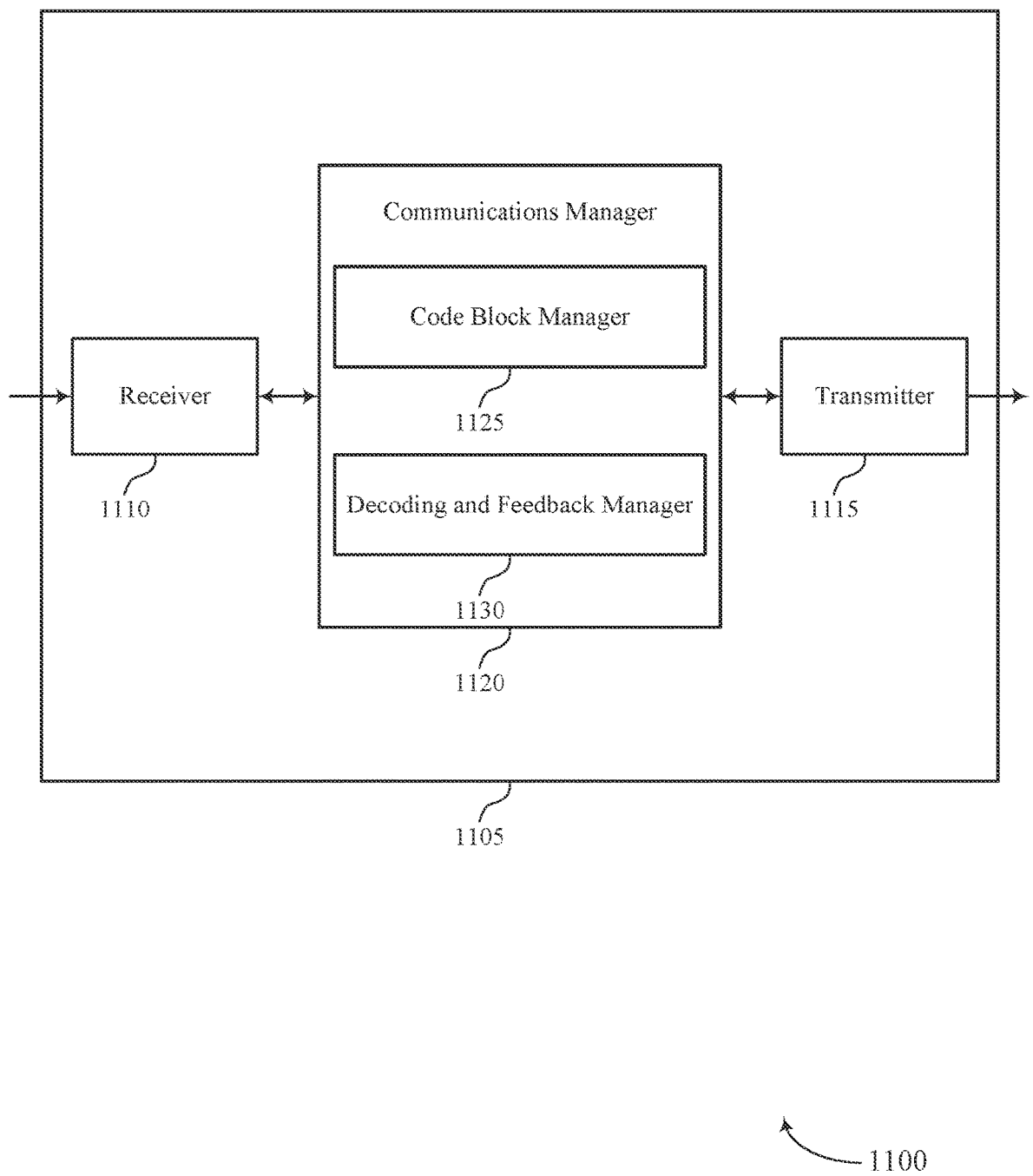

FIG. 11 shows a block diagram 1100 of a device 1105 that supports hierarchical CRC techniques in accordance with aspects of the present disclosure. The device 1105 may be an example of aspects of a device 1005 or a UE 115 as described herein. The device 1105 may include a receiver 1110, a transmitter 1115, and a communications manager 1120. The device 1105 may also include a processor. Each of these components may be in communication with one another (e.g., via one or more buses).

The receiver 1110 may provide a means for receiving information such as packets, user data, control information, or any combination thereof associated with various information channels (e.g., control channels, data channels, information channels related to hierarchical CRC). Information may be passed on to other components of the device 1105. The receiver 1110 may utilize a single antenna or a set of multiple antennas.

The transmitter 1115 may provide a means for transmitting signals generated by other components of the device 1105. For example, the transmitter 1115 may transmit information such as packets, user data, control information, or any combination thereof associated with various information channels (e.g., control channels, data channels, information channels related to hierarchical CRC). In some examples, the transmitter 1115 may be co-located with a receiver 1110 in a transceiver module. The transmitter 1115 may utilize a single antenna or a set of multiple antennas.

The device 1105, or various components thereof, may be an example of means for performing various aspects of hierarchical CRC as described herein. For example, the communications manager 1120 may include a CB manager 1125 a decoding and feedback manager 1130, or any combination thereof. The communications manager 1120 may be an example of aspects of a communications manager 1020 as described herein. In some examples, the communications manager 1120, or various components thereof, may be configured to perform various operations (e.g., receiving, monitoring, transmitting) using or otherwise in cooperation with the receiver 1110, the transmitter 1115, or both. For example, the communications manager 1120 may receive information from the receiver 1110, send information to the transmitter 1115, or be integrated in combination with the receiver 1110, the transmitter 1115, or both to receive information, transmit information, or perform various other operations as described herein.

The communications manager 1120 may support wireless communication in accordance with examples as disclosed herein. The CB manager 1125 may be configured as or otherwise support a means for receiving a message including a set of multiple CBs, where each CB of the set of multiple CBs is appended with a first set of CRC bits having a first size, and where two or more concatenated CBs of the set of multiple CBs are appended with a second set of CRC bits having a second size. The decoding and feedback manager 1130 may be configured as or otherwise support a means for attempting to decode the plurality of CBs based at least in part on receiving the message.

Figure 12:
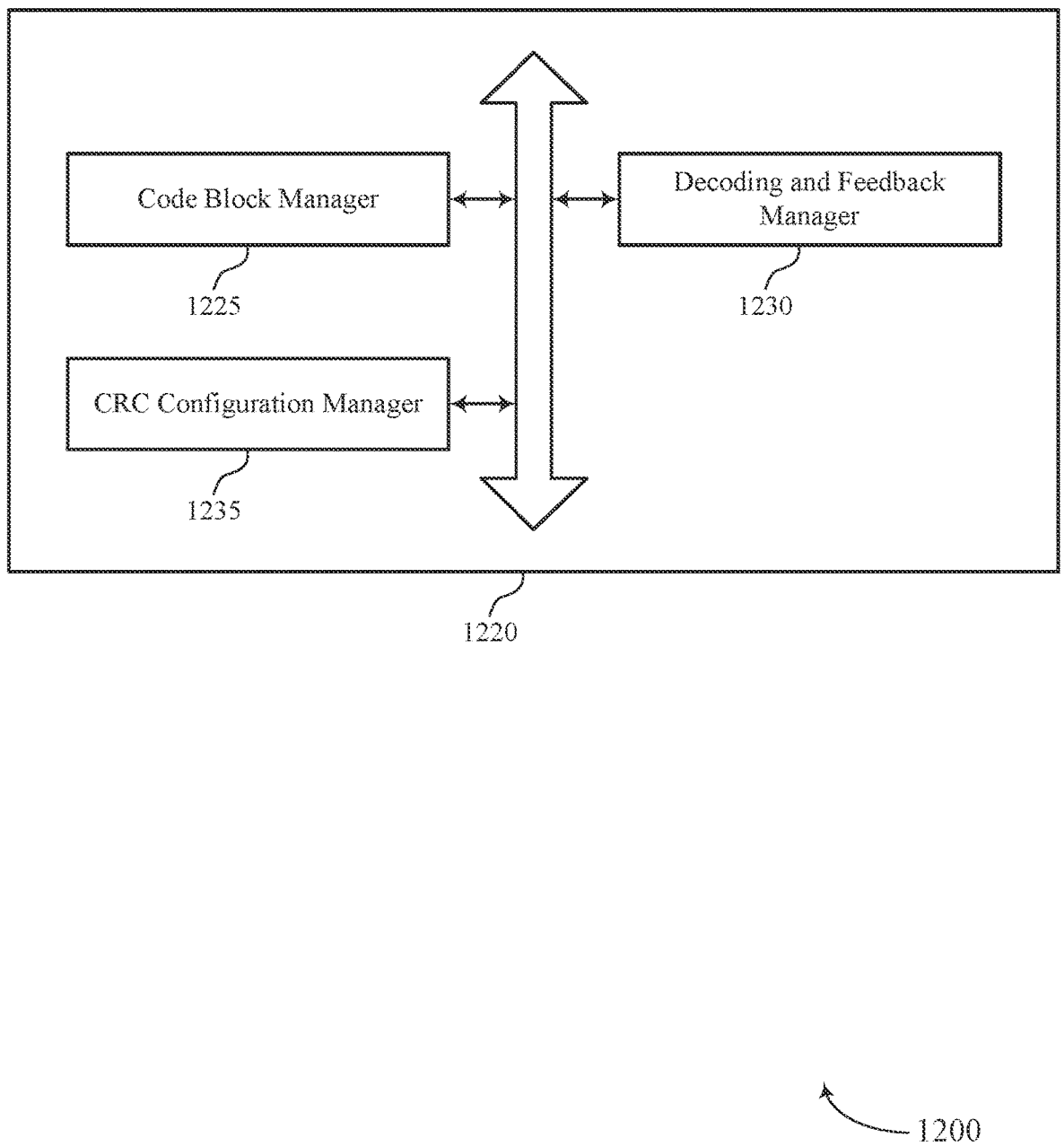
FIG. 12 shows a block diagram of a communications manager that supports hierarchical CRC techniques in accordance with aspects of the present disclosure.

FIG. 12 shows a block diagram 1200 of a communications manager 1220 that supports hierarchical CRC techniques in accordance with aspects of the present disclosure. The communications manager 1220 may be an example of aspects of a communications manager 1020, a communications manager 1120, or both, as described herein. The communications manager 1220, or various components thereof, may be an example of means for performing various aspects of hierarchical CRC as described herein. For example, the communications manager 1220 may include a CB manager 1225, a decoding and feedback manager 1230, an CRC configuration manager 1235, or any combination thereof. Each of these components may communicate, directly or indirectly, with one another (e.g., via one or more buses).

The communications manager 1220 may support wireless communication in accordance with examples as disclosed herein. The CB manager 1225 may be configured as or otherwise support a means for receiving a message including a set of multiple CBs, where each CB of the set of multiple CBs is appended with a first set of CRC bits having a first size, and where two or more concatenated CBs of the set of multiple CBs are appended with a second set of CRC bits having a second size. The decoding and feedback manager 1230 may be configured as or otherwise support a means for attempting to decode the plurality of CBs based at least in part on receiving the message.

In some examples, the decoding and feedback manager 1230 may be configured as or otherwise support a means for transmitting a feedback message indicating a decoding failure for one or more CBs including the appended first set of CRC bits, or a decoding failure for a first set of CBs including the appended second set of CRC bits, or any combination thereof.

In some examples, the CB manager 1225 may be configured as or otherwise support a means for receiving a retransmission of a single CB based on the feedback message indicating the decoding failure associated with the one or more CBs including the appended first set of CRC bits.

In some examples, the CB manager 1225 may be configured as or otherwise support a means for receiving a retransmission of the first set of CBs based on the feedback message indicating the decoding failure associated with the first set of CBs including the appended second set of CRC bits.

In some examples, the CRC configuration manager 1235 may be configured as or otherwise support a means for receiving a second message indicating a CRC configuration, where the message includes the set of multiple CBs having the appended first set of CRC bits and the two or more concatenated CBs having the appended second set of CRC bits based on the CRC configuration.

In some examples, the second message is received via MAC-CE signaling, DCI, RRC signaling, or any combination thereof.

In some examples, a first CB of the two or more concatenated CBs is appended with a first portion of the second set of CRC bits and a second CB of the two or more concatenated CBs is appended with a second portion of the second set of CRC bits.

In some examples, the message includes a third set of CRC bits appended to a concatenation of a first set of CBs and a second set of CBs, the first set of CBs including the two or more concatenated CBs with the second set of CRC bits appended to the first set of CBs, and the second set of CBs including two or more additional concatenated CBs with the second set of CRC bits appended to the second set of CBs. In some examples, decoding the message is based on the third set of CRC bits appended to the concatenation of the first set of CBs and the second set of CBs.

In some examples, a total number of CRC bits of the message includes a sum of the first set of CRC bits and the second set of CRC bits.

Figure 13:
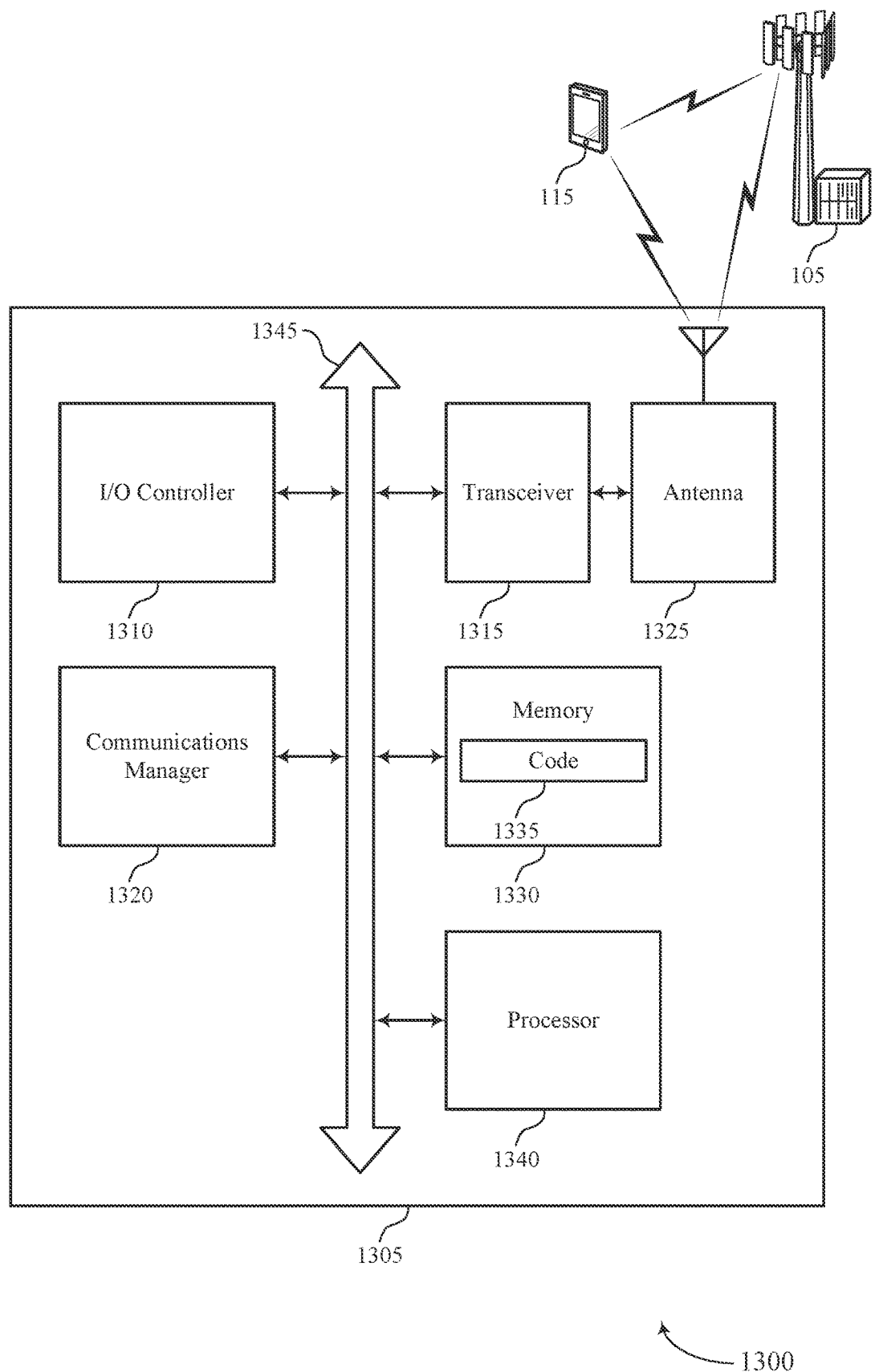
FIG. 13 shows a diagram of a system including a device that supports hierarchical CRC techniques in accordance with aspects of the present disclosure.

FIG. 13 shows a diagram of a system 1300 including a device 1305 that supports hierarchical CRC techniques in accordance with aspects of the present disclosure. The device 1305 may be an example of or include the components of a device 1005, a device 1105, or a UE 115 as described herein. The device 1305 may communicate wirelessly with one or more base stations 105, UEs 115, or any combination thereof. The device 1305 may include components for bi-directional voice and data communications including components for transmitting and receiving communications, such as a communications manager 1320, an input/output (I/O) controller 1310, a transceiver 1315, an antenna 1325, a memory 1330, code 1335, and a processor 1340. These components may be in electronic communication or otherwise coupled (e.g., operatively, communicatively, functionally, electronically, electrically) via one or more buses (e.g., a bus 1345).

The I/O controller 1310 may manage input and output signals for the device 1305. The I/O controller 1310 may also manage peripherals not integrated into the device 1305. In some cases, the I/O controller 1310 may represent a physical connection or port to an external peripheral. In some cases, the I/O controller 1310 may utilize an operating system such as iOS®, ANDROID®, MS-DOS®, MS-WINDOWS®, OS/2®, UNIX®, LINUX®, or another known operating system. Additionally or alternatively, the I/O controller 1310 may represent or interact with a modem, a keyboard, a mouse, a touchscreen, or a similar device. In some cases, the I/O controller 1310 may be implemented as part of a processor, such as the processor 1340. In some cases, a user may interact with the device 1305 via the I/O controller 1310 or via hardware components controlled by the I/O controller 1310.

In some cases, the device 1305 may include a single antenna 1325. However, in some other cases, the device 1305 may have more than one antenna 1325, which may be capable of concurrently transmitting or receiving multiple wireless transmissions. The transceiver 1315 may communicate bi-directionally, via the one or more antennas 1325, wired, or wireless links as described herein. For example, the transceiver 1315 may represent a wireless transceiver and may communicate bi-directionally with another wireless transceiver. The transceiver 1315 may also include a modem to modulate the packets, to provide the modulated packets to one or more antennas 1325 for transmission, and to demodulate packets received from the one or more antennas 1325. The transceiver 1315, or the transceiver 1315 and one or more antennas 1325, may be an example of a transmitter 1015, a transmitter 1115, a receiver 1010, a receiver 1110, or any combination thereof or component thereof, as described herein.

The memory 1330 may include RAM and ROM. The memory 1330 may store computer-readable, computer-executable code 1335 including instructions that, when executed by the processor 1340, cause the device 1305 to perform various functions described herein. The code 1335 may be stored in a non-transitory computer-readable medium such as system memory or another type of memory. In some cases, the code 1335 may not be directly executable by the processor 1340 but may cause a computer (e.g., when compiled and executed) to perform functions described herein. In some cases, the memory 1330 may contain, among other things, a BIOS that may control basic hardware or software operation such as the interaction with peripheral components or devices.

The processor 1340 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1340 may be configured to operate a memory array using a memory controller. In some other cases, a memory controller may be integrated into the processor 1340. The processor 1340 may be configured to execute computer-readable instructions stored in a memory (e.g., the memory 1330) to cause the device 1305 to perform various functions (e.g., functions or tasks supporting hierarchical CRC). For example, the device 1305 or a component of the device 1305 may include a processor 1340 and memory 1330 coupled to the processor 1340, the processor 1340 and memory 1330 configured to perform various functions described herein.

The communications manager 1320 may support wireless communication in accordance with examples as disclosed herein. For example, the communications manager 1320 may be configured as or otherwise support a means for receiving a message including a set of multiple CBs, where each CB of the set of multiple CBs is appended with a first set of CRC bits having a first size, and where two or more concatenated CBs of the set of multiple CBs are appended with a second set of CRC bits having a second size. The communications manager 1320 may be configured as or otherwise support a means for attempting to decode the plurality of CBs based at least in part on receiving the message.

By including or configuring the communications manager 1320 in accordance with examples as described herein, the device 1305 may support techniques for improved communication reliability, reduced latency, improved user experience related to higher data rates, more efficient utilization of communication resources, improved coordination between devices, and improved utilization of processing capability.

In some examples, the communications manager 1320 may be configured to perform various operations (e.g., receiving, monitoring, transmitting) using or otherwise in cooperation with the transceiver 1315, the one or more antennas 1325, or any combination thereof. Although the communications manager 1320 is illustrated as a separate component, in some examples, one or more functions described with reference to the communications manager 1320 may be supported by or performed by the processor 1340, the memory 1330, the code 1335, or any combination thereof. For example, the code 1335 may include instructions executable by the processor 1340 to cause the device 1305 to perform various aspects of hierarchical CRC as described herein, or the processor 1340 and the memory 1330 may be otherwise configured to perform or support such operations.

Figure 14:
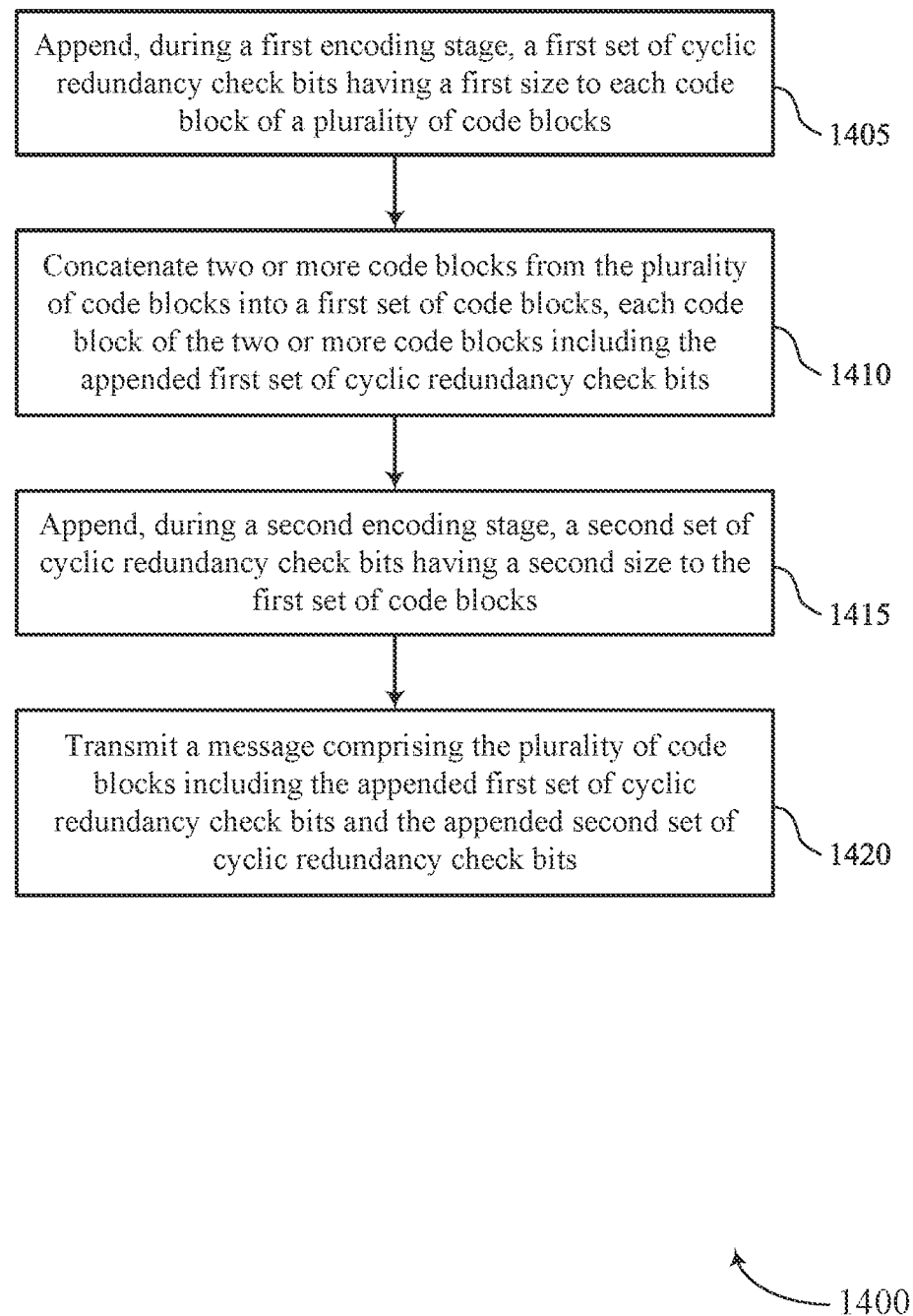
FIGS. 14 through 19 show flowcharts illustrating methods that support hierarchical CRC techniques in accordance with aspects of the present disclosure.

FIG. 14 shows a flowchart illustrating a method 1400 that supports hierarchical CRC techniques in accordance with aspects of the present disclosure. The operations of the method 1400 may be implemented by a base station or its components as described herein. For example, the operations of the method 1400 may be performed by a base station 105 as described with reference to FIGS. 1 through 9. In some examples, a base station may execute a set of instructions to control the functional elements of the base station to perform the described functions. Additionally or alternatively, the base station may perform aspects of the described functions using special-purpose hardware.

At 1405, the method may include appending, during a first encoding stage, a first set of CRC bits having a first size to each CB of a set of multiple CBs. The operations of 1405 may be performed in accordance with examples as disclosed herein. In some examples, aspects of the operations of 1405 may be performed by an CRC bit manager 825 as described with reference to FIG. 8.

At 1410, the method may include concatenating two or more CBs from the set of multiple CBs into a first set of CBs, each CB of the two or more CBs including the appended first set of CRC bits. The operations of 1410 may be performed in accordance with examples as disclosed herein. In some examples, aspects of the operations of 1410 may be performed by a CB manager 830 as described with reference to FIG. 8.

At 1415, the method may include appending, during a second encoding stage, a second set of CRC bits having a second size to the first set of CBs. The operations of 1415 may be performed in accordance with examples as disclosed herein. In some examples, aspects of the operations of 1415 may be performed by an CRC bit manager 825 as described with reference to FIG. 8.

At 1420, the method may include transmitting a message including the set of multiple CBs including the appended first set of CRC bits and the appended second set of CRC bits. The operations of 1420 may be performed in accordance with examples as disclosed herein. In some examples, aspects of the operations of 1420 may be performed by a CB transmission manager 835 as described with reference to FIG. 8.

Figure 15:
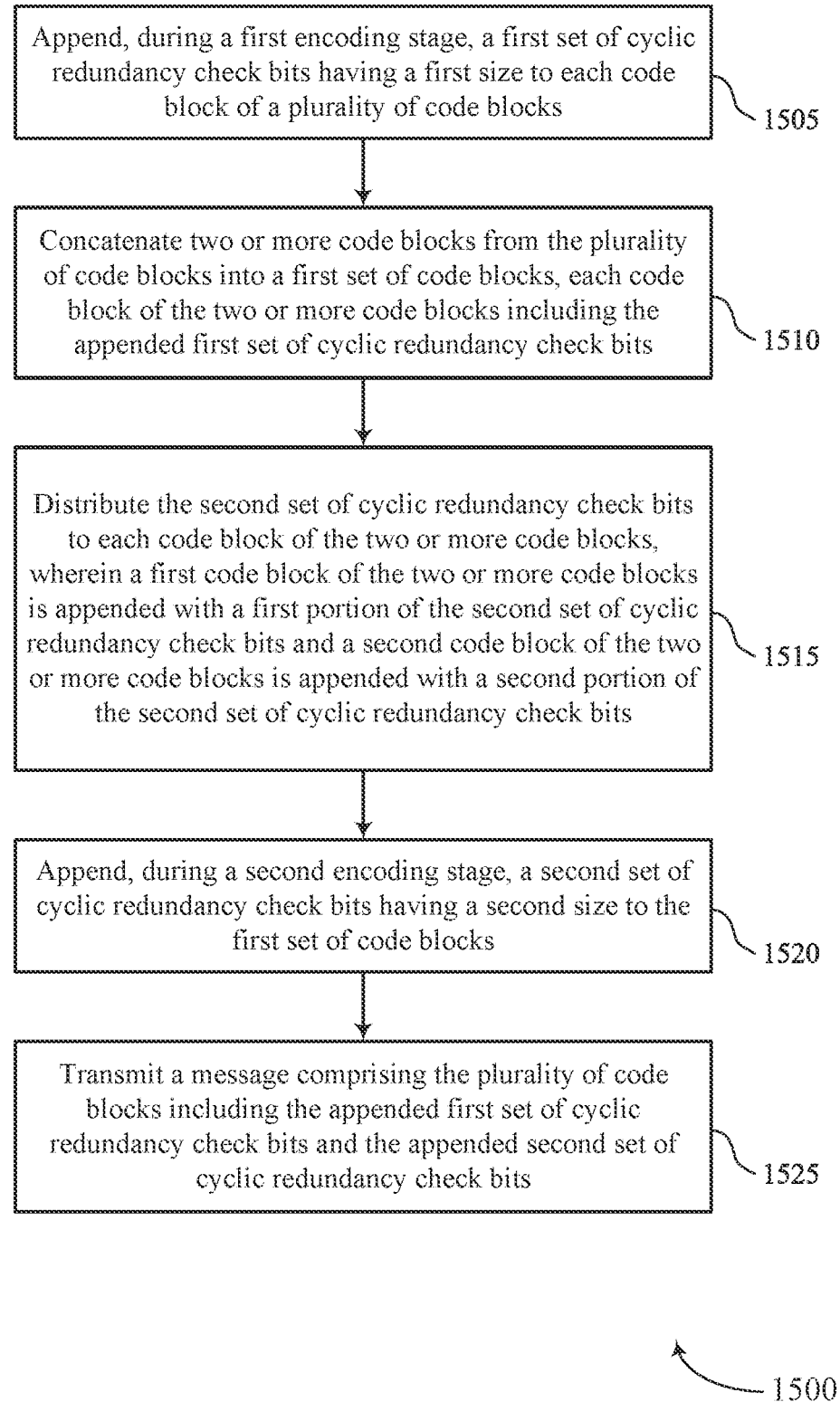

FIG. 15 shows a flowchart illustrating a method 1500 that supports hierarchical CRC techniques in accordance with aspects of the present disclosure. The operations of the method 1500 may be implemented by a base station or its components as described herein. For example, the operations of the method 1500 may be performed by a base station 105 as described with reference to FIGS. 1 through 9. In some examples, a base station may execute a set of instructions to control the functional elements of the base station to perform the described functions. Additionally or alternatively, the base station may perform aspects of the described functions using special-purpose hardware.

At 1505, the method may include appending, during a first encoding stage, a first set of CRC bits having a first size to each CB of a set of multiple CBs. The operations of 1505 may be performed in accordance with examples as disclosed herein. In some examples, aspects of the operations of 1505 may be performed by an CRC bit manager 825 as described with reference to FIG. 8.

At 1510, the method may include concatenating two or more CBs from the set of multiple CBs into a first set of CBs, each CB of the two or more CBs including the appended first set of CRC bits. The operations of 1510 may be performed in accordance with examples as disclosed herein. In some examples, aspects of the operations of 1510 may be performed by a CB manager 830 as described with reference to FIG. 8.

At 1515, the method may include distributing the second set of CRC bits to each CB of the two or more CBs, where a first CB of the two or more CBs is appended with a first portion of the second set of CRC bits and a second CB of the two or more CBs is appended with a second portion of the second set of CRC bits. The operations of 1515 may be performed in accordance with examples as disclosed herein. In some examples, aspects of the operations of 1515 may be performed by an CRC bit manager 825 as described with reference to FIG. 8.

At 1520, the method may include appending, during a second encoding stage, a second set of CRC bits having a second size to the first set of CBs. The operations of 1520 may be performed in accordance with examples as disclosed herein. In some examples, aspects of the operations of 1520 may be performed by an CRC bit manager 825 as described with reference to FIG. 8.

At 1525, the method may include transmitting a message including the set of multiple CBs including the appended first set of CRC bits and the appended second set of CRC bits. The operations of 1525 may be performed in accordance with examples as disclosed herein. In some examples, aspects of the operations of 1525 may be performed by a CB transmission manager 835 as described with reference to FIG. 8.

Figure 16:
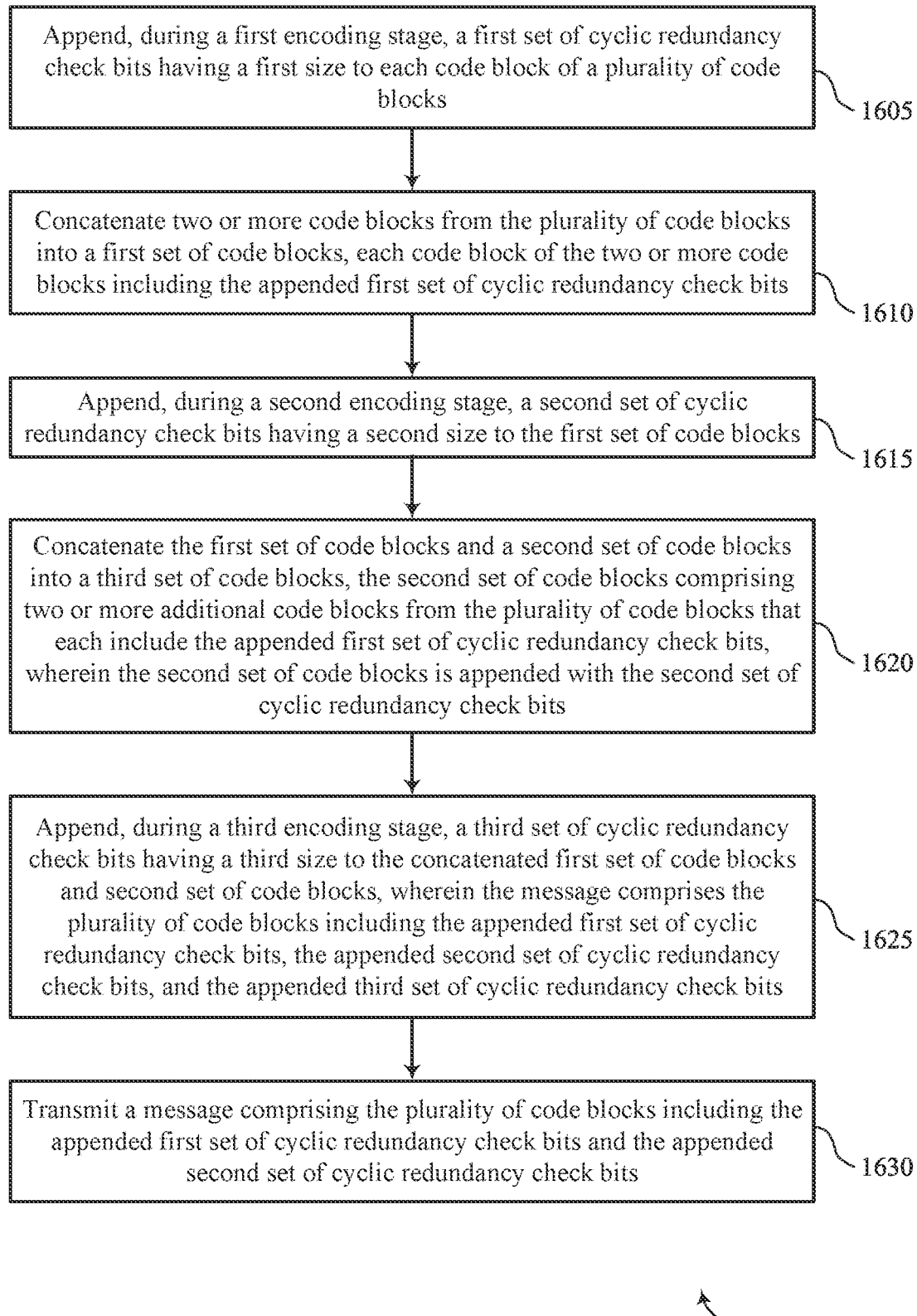

FIG. 16 shows a flowchart illustrating a method 1600 that supports hierarchical CRC techniques in accordance with aspects of the present disclosure. The operations of the method 1600 may be implemented by a base station or its components as described herein. For example, the operations of the method 1600 may be performed by a base station 105 as described with reference to FIGS. 1 through 9. In some examples, a base station may execute a set of instructions to control the functional elements of the base station to perform the described functions. Additionally or alternatively, the base station may perform aspects of the described functions using special-purpose hardware.

At 1605, the method may include appending, during a first encoding stage, a first set of CRC bits having a first size to each CB of a set of multiple CBs. The operations of 1605 may be performed in accordance with examples as disclosed herein. In some examples, aspects of the operations of 1605 may be performed by an CRC bit manager 825 as described with reference to FIG. 8.

At 1610, the method may include concatenating two or more CBs from the set of multiple CBs into a first set of CBs, each CB of the two or more CBs including the appended first set of CRC bits. The operations of 1610 may be performed in accordance with examples as disclosed herein. In some examples, aspects of the operations of 1610 may be performed by a CB manager 830 as described with reference to FIG. 8.

At 1615, the method may include appending, during a second encoding stage, a second set of CRC bits having a second size to the first set of CBs. The operations of 1615 may be performed in accordance with examples as disclosed herein. In some examples, aspects of the operations of 1615 may be performed by an CRC bit manager 825 as described with reference to FIG. 8.

At 1620, the method may include concatenating the first set of CBs and a second set of CBs into a third set of CBs, the second set of CBs including two or more additional CBs from the set of multiple CBs that each includes the appended first set of CRC bits, where the second set of CBs is appended with the second set of CRC bits. The operations of 1620 may be performed in accordance with examples as disclosed herein. In some examples, aspects of the operations of 1620 may be performed by a CB manager 830 as described with reference to FIG. 8.

At 1625, the method may include appending, during a third encoding stage, a third set of CRC bits having a third size to the concatenated first set of CBs and second set of CBs, where the message includes the set of multiple CBs including the appended first set of CRC bits, the appended second set of CRC bits, and the appended third set of CRC bits. The operations of 1625 may be performed in accordance with examples as disclosed herein. In some examples, aspects of the operations of 1625 may be performed by an CRC bit manager 825 as described with reference to FIG. 8.

At 1630, the method may include transmitting a message including the set of multiple CBs including the appended first set of CRC bits and the appended second set of CRC bits. The operations of 1630 may be performed in accordance with examples as disclosed herein. In some examples, aspects of the operations of 1630 may be performed by a CB transmission manager 835 as described with reference to FIG. 8.

Figure 17:
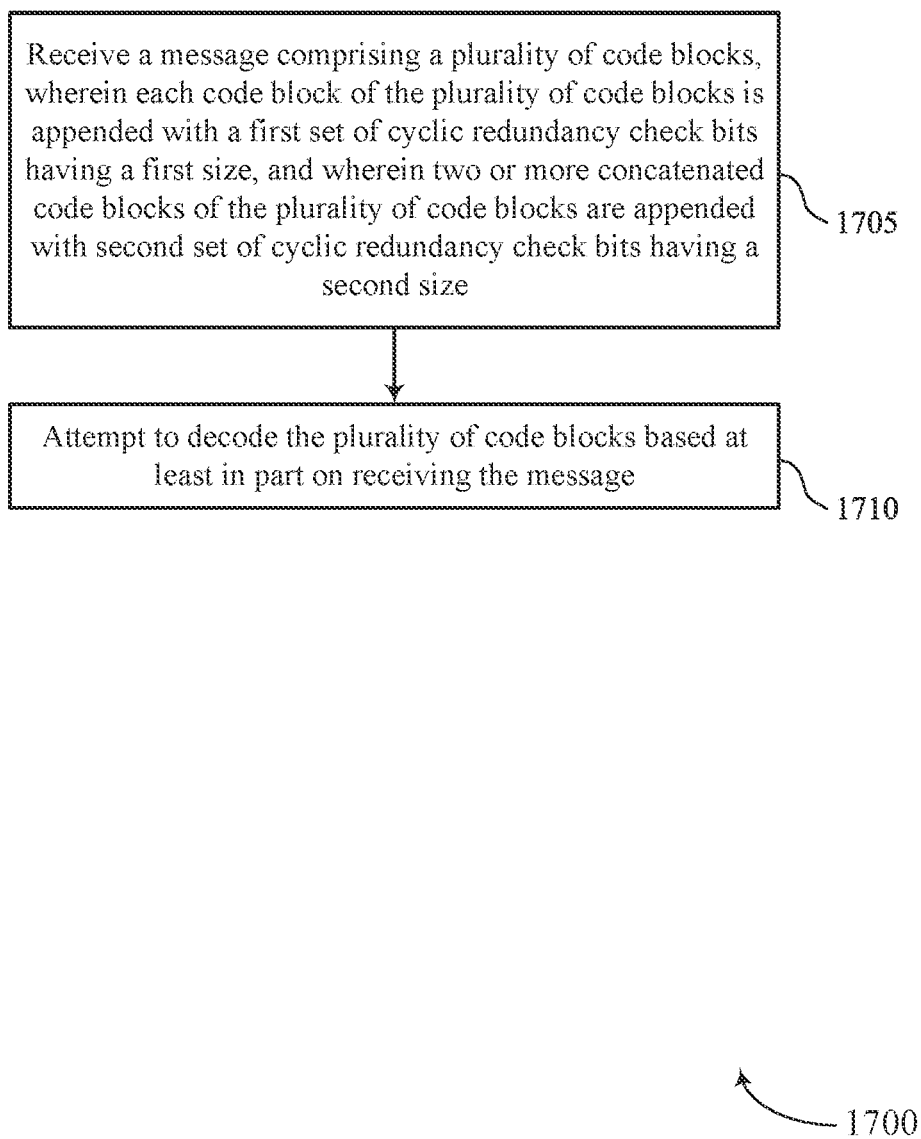

FIG. 17 shows a flowchart illustrating a method 1700 that supports hierarchical CRC techniques in accordance with aspects of the present disclosure. The operations of the method 1700 may be implemented by a UE or its components as described herein. For example, the operations of the method 1700 may be performed by a UE 115 as described with reference to FIGS. 1 through 5 and 10 through 13. In some examples, a UE may execute a set of instructions to control the functional elements of the UE to perform the described functions. Additionally or alternatively, the UE may perform aspects of the described functions using special-purpose hardware.

At 1705, the method may include receiving a message including a set of multiple CBs, where each CB of the set of multiple CBs is appended with a first set of CRC bits having a first size, and where two or more concatenated CBs of the set of multiple CBs are appended with a second set of CRC bits having a second size. The operations of 1705 may be performed in accordance with examples as disclosed herein. In some examples, aspects of the operations of 1705 may be performed by a CB manager 1225 as described with reference to FIG. 12.

At 1710, the method may include attempting to decode the plurality of code blocks based at least in part on receiving the message. The operations of 1710 may be performed in accordance with examples as disclosed herein. In some examples, aspects of the operations of 1710 may be performed by a decoding and feedback manager 1230 as described with reference to FIG. 12.

Figure 18:
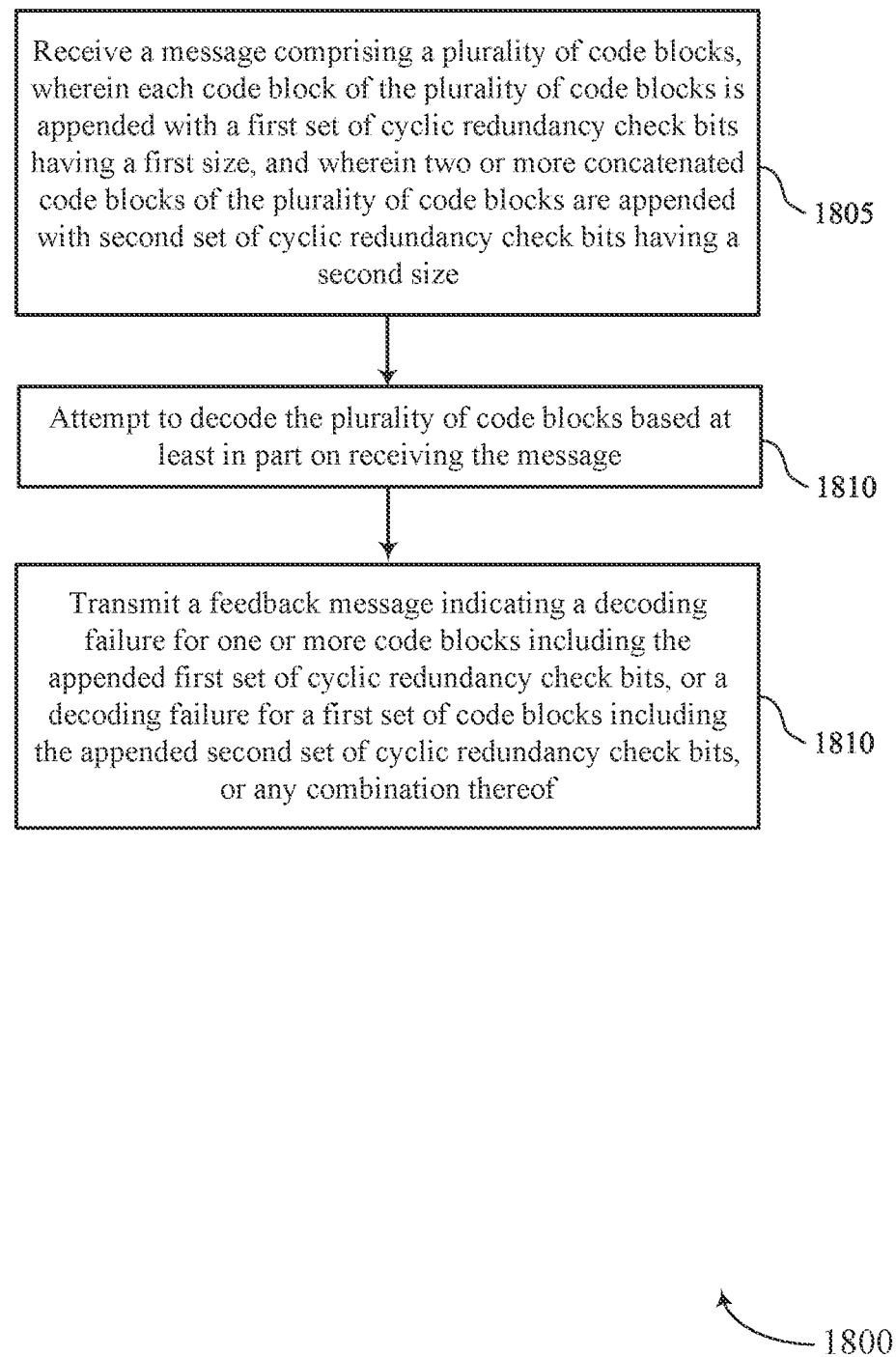

FIG. 18 shows a flowchart illustrating a method 1800 that supports hierarchical CRC techniques in accordance with aspects of the present disclosure. The operations of the method 1800 may be implemented by a UE or its components as described herein. For example, the operations of the method 1800 may be performed by a UE 115 as described with reference to FIGS. 1 through 5 and 10 through 13. In some examples, a UE may execute a set of instructions to control the functional elements of the UE to perform the described functions. Additionally or alternatively, the UE may perform aspects of the described functions using special-purpose hardware.

At 1805, the method may include receiving a message including a set of multiple CBs, where each CB of the set of multiple CBs is appended with a first set of CRC bits having a first size, and where two or more concatenated CBs of the set of multiple CBs are appended with a second set of CRC bits having a second size. The operations of 1805 may be performed in accordance with examples as disclosed herein. In some examples, aspects of the operations of 1805 may be performed by a CB manager 1225 as described with reference to FIG. 12.

At 1810, the method may include attempting to decode the plurality of code blocks based at least in part on receiving the message. The operations of 1810 may be performed in accordance with examples as disclosed herein. In some examples, aspects of the operations of 1810 may be performed by a decoding and feedback manager 1230 as described with reference to FIG. 12.

At 1815, the method may include transmitting a feedback message indicating a decoding failure for one or more CBs including the appended first set of CRC bits, or a decoding failure for a first set of CBs including the appended second set of CRC bits, or any combination thereof. The operations of 1815 may be performed in accordance with examples as disclosed herein. In some examples, aspects of the operations of 1815 may be performed by a decoding and feedback manager 1230 as described with reference to FIG. 12.

Figure 19:
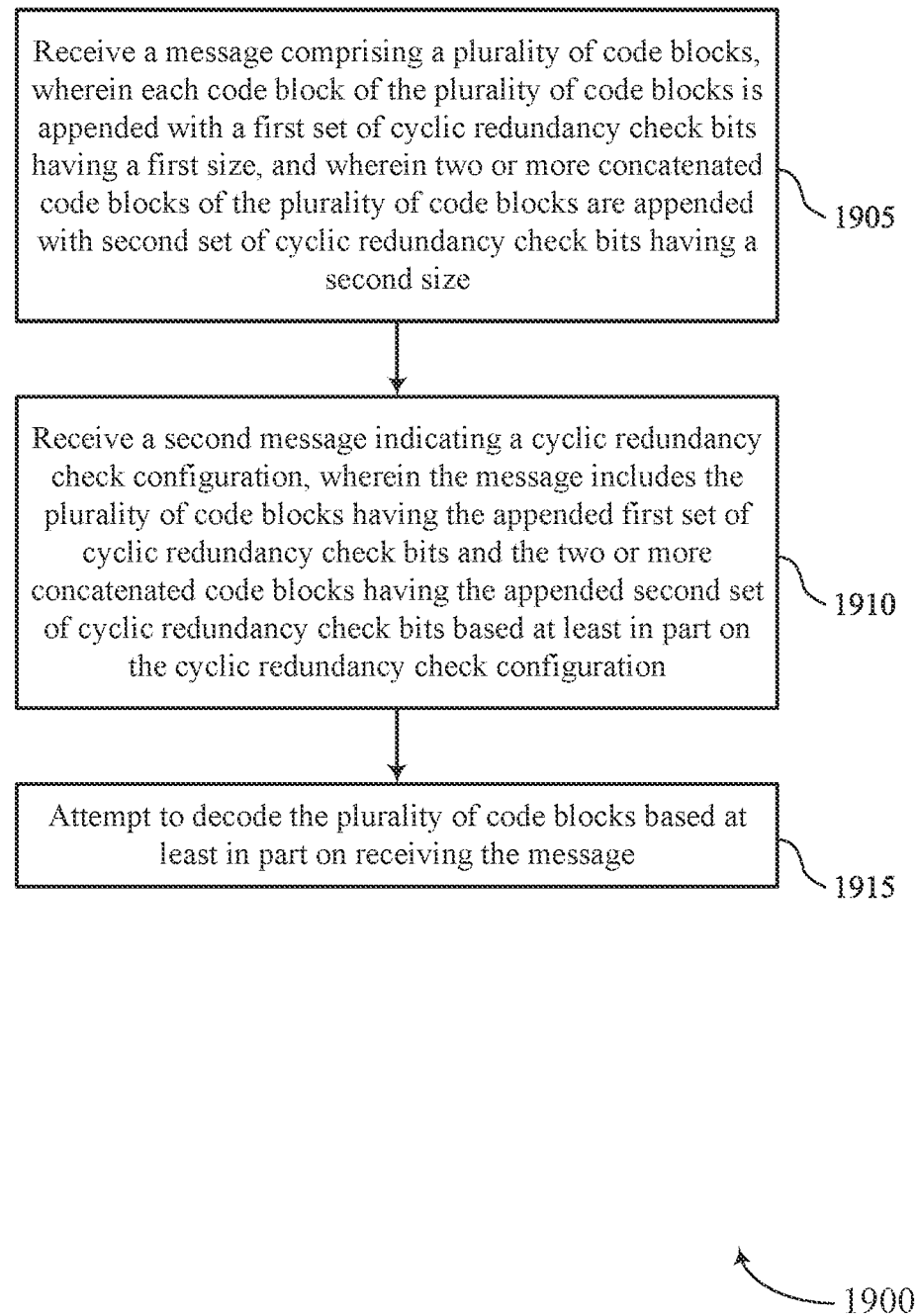

FIG. 19 shows a flowchart illustrating a method 1900 that supports hierarchical CRC techniques in accordance with aspects of the present disclosure. The operations of the method 1900 may be implemented by a UE or its components as described herein. For example, the operations of the method 1900 may be performed by a UE 115 as described with reference to FIGS. 1 through 5 and 10 through 13. In some examples, a UE may execute a set of instructions to control the functional elements of the UE to perform the described functions. Additionally or alternatively, the UE may perform aspects of the described functions using special-purpose hardware.

At 1905, the method may include receiving a message including a set of multiple CBs, where each CB of the set of multiple CBs is appended with a first set of CRC bits having a first size, and where two or more concatenated CBs of the set of multiple CBs are appended with a second set of CRC bits having a second size. The operations of 1905 may be performed in accordance with examples as disclosed herein. In some examples, aspects of the operations of 1905 may be performed by a CB manager 1225 as described with reference to FIG. 12.

At 1910, the method may include receiving a second message indicating a CRC configuration, where the message includes the set of multiple CBs having the appended first set of CRC bits and the two or more concatenated CBs having the appended second set of CRC bits based on the CRC configuration. The operations of 1910 may be performed in accordance with examples as disclosed herein. In some examples, aspects of the operations of 1910 may be performed by an CRC configuration manager 1235 as described with reference to FIG. 12.

At 1915, the method may include attempting to decode the plurality of code blocks based at least in part on receiving the message. The operations of 1915 may be performed in accordance with examples as disclosed herein. In some examples, aspects of the operations of 1915 may be performed by a decoding and feedback manager 1230 as described with reference to FIG. 12.

The following provides an overview of aspects of the present disclosure:

Aspect 1: A method for wireless communication, comprising: appending, during a first encoding stage, a first set of CRC bits having a first size to each CB of a plurality of CBs; concatenating two or more CBs from the plurality of CBs into a first set of CBs, each CB of the two or more CBs including the appended first set of CRC bits; appending, during a second encoding stage, a second set of CRC bits having a second size to the first set of CBs; and transmitting a message comprising the plurality of CBs including the appended first set of CRC bits and the appended second set of CRC bits.

Aspect 2: The method of aspect 1, further comprising: distributing the second set of CRC bits to each CB of the two or more CBs, wherein a first CB of the two or more CBs is appended with a first portion of the second set of CRC bits and a second CB of the two or more CBs is appended with a second portion of the second set of CRC bits.

Aspect 3: The method of any of aspects 1 through 2, further comprising: concatenating the first set of CBs and a second set of CBs into a third set of CBs, the second set of CBs comprising two or more additional CBs from the plurality of CBs that each includes the appended first set of CRC bits, wherein the second set of CBs is appended with the second set of CRC bits; and appending, during a third encoding stage, a third set of CRC bits having a third size to the concatenated first set of CBs and second set of CBs, wherein the message comprises the plurality of CBs including the appended first set of CRC bits, the appended second set of CRC bits, and the appended third set of CRC bits.

Aspect 4: The method of aspect 3, further comprising: distributing the third set of CRC bits to the first set of CBs and the second set of CBs, wherein the first set of CBs is appended with a first portion of the third set of CRC bits and the second set of CBs is appended with a second portion of the third set of CRC bits.

Aspect 5: The method of any of aspects 1 through 4, further comprising: transmitting a second message indicating a CRC configuration, wherein appending the first set of CRC bits, concatenating the two or more CBs, and appending the second set of CRC bits is based at least in part on the CRC configuration.

Aspect 6: The method of aspect 5, wherein the second message is transmitted via MAC-CE signaling, DCI, RRC signaling, or any combination thereof.

Aspect 7: The method of any of aspects 1 through 6, wherein the first encoding stage and the second encoding stage are from a plurality of encoding stages for encoding the message, each encoding stage of the plurality of encoding stages being associated with appending respective sets of CRC bits to one or more CBs of the plurality of CBs.

Aspect 8: The method of any of aspects 1 through 7, further comprising: determining a set of CRC bits corresponding to respective encoding stages and one or more polynomial functions associated with the set of CRC bits; and determining a number of the plurality of CBs corresponding to the respective encoding stages, wherein appending the first set of CRC bits, concatenating the two or more CBs, and appending the second set of CRC bits is based at least in part on the set of CRC bits, the one or more polynomial functions, the number of the plurality of CBs, and the respective encoding stages.

Aspect 9: The method of any of aspects 1 through 8, further comprising: receiving a feedback message in response to the transmitted message; and retransmitting one or more CBs from the plurality of CBs based at least in part on the feedback message indicating a decoding failure associated with the one or more CBs including the appended first set of CRC bits having the first size or a decoding failure associated with the first set of CBs including the appended second set of CRC bits having the second size.

Aspect 10: The method of aspect 9, wherein retransmitting the one or more CBs from the plurality of CBs comprises: retransmitting a single CB based at least in part on the feedback message indicating the decoding failure associated with the one or more CBs including the appended first set of CRC bits having the first size.

Aspect 11: The method of any of aspects 9 through 10, wherein retransmitting the one or more CBs from the plurality of CBs comprises: retransmitting the first set of CBs based at least in part on the feedback message indicating the decoding failure associated with the first set of CBs including the appended second set of CRC bits having the second size.

Aspect 12: The method of any of aspects 1 through 11, further comprising: selecting a CRC encoding scheme from a plurality of CRC encoding schemes, wherein appending the first set of CRC bits, concatenating the two or more CBs, and appending the second set of CRC bits is based at least in part on the CRC encoding scheme.

Aspect 13: The method of aspect 12, wherein the CRC encoding scheme indicates whether the second set of CRC bits are appended to a last CB of the first set of CBs or distributed to each CB of the first set of CBs.

Aspect 14: The method of any of aspects 12 through 13, wherein the CRC encoding scheme is selected from a preconfigured list of CRC encoding schemes.

Aspect 15: The method of any of aspects 12 through 14, wherein the CRC encoding scheme is semi-statically selected based at least in part on a channel type for transmitting the message, a size of respective CBs from the plurality of CBs, or a size of CB groups, or any combination thereof.

Aspect 16: The method of any of aspects 12 through 15, wherein the CRC encoding scheme is dynamically selected based at least in part on an error probability associated with transmitting the message.

Aspect 17: The method of any of aspects 1 through 16, wherein a total number of CRC bits of the message comprises a sum of the first set of CRC bits and the second set of CRC bits.

Aspect 18: The method of any of aspects 1 through 17, wherein the second set of CRC bits are appended to a temporally last CB of the first set of CBs based at least in part on concatenating the two or more CBs.

Aspect 19: A method for wireless communication, comprising: receiving a message comprising a plurality of CBs, wherein each CB of the plurality of CBs is appended with a first set of CRC bits having a first size, and wherein two or more concatenated CBs of the plurality of CBs are appended with a second set of CRC bits having a second size; and attempting to decode the plurality of CBs based at least in part on receiving the message.

Aspect 20: The method of aspect 19, further comprising: transmitting a feedback message indicating a decoding failure for one or more CBs including the appended first set of CRC bits, or a decoding failure for a first set of CBs including the appended second set of CRC bits, or any combination thereof.

Aspect 21: The method of aspect 20, further comprising: receiving a retransmission of a single CB based at least in part on the feedback message indicating the decoding failure associated with the one or more CBs including the appended first set of CRC bits.

Aspect 22: The method of any of aspects 20 through 21, further comprising: receiving a retransmission of the first set of CBs based at least in part on the feedback message indicating the decoding failure associated with the first set of CBs including the appended second set of CRC bits.

Aspect 23: The method of any of aspects 19 through 22, further comprising: receiving a second message indicating a CRC configuration, wherein the message includes the plurality of CBs having the appended first set of CRC bits and the two or more concatenated CBs having the appended second set of CRC bits based at least in part on the CRC configuration.

Aspect 24: The method of aspect 23, wherein the second message is received via MAC-CE signaling, DCI, RRC signaling, or any combination thereof.

Aspect 25: The method of any of aspects 19 through 24, wherein a first CB of the two or more concatenated CBs is appended with a first portion of the second set of CRC bits and a second CB of the two or more concatenated CBs is appended with a second portion of the second set of CRC bits.

Aspect 26: The method of any of aspects 19 through 25, wherein the message comprises a third set of CRC bits appended to a concatenation of a first set of CBs and a second set of CBs, the first set of CBs comprising the two or more concatenated CBs with the second set of CRC bits appended to the first set of CBs, and the second set of CBs comprising two or more additional concatenated CBs with the second set of CRC bits appended to the second set of CBs, and decoding the message is based at least in part on the third set of CRC bits appended to the concatenation of the first set of CBs and the second set of CBs.

Aspect 27: The method of any of aspects 19 through 26, wherein a total number of CRC bits of the message comprises a sum of the first set of CRC bits and the second set of CRC bits.

Aspect 28: An apparatus for wireless communication, comprising a processor; memory coupled with the processor; and instructions stored in the memory and executable by the processor to cause the apparatus to perform a method of any of aspects 1 through 18.

Aspect 29: An apparatus for wireless communication, comprising at least one means for performing a method of any of aspects 1 through 18.

Aspect 30: A non-transitory computer-readable medium storing code for wireless communication, the code comprising instructions executable by a processor to perform a method of any of aspects 1 through 18.

Aspect 31: An apparatus for wireless communication, comprising a processor; memory coupled with the processor; and instructions stored in the memory and executable by the processor to cause the apparatus to perform a method of any of aspects 19 through 27.

Aspect 32: An apparatus for wireless communication, comprising at least one means for performing a method of any of aspects 19 through 27.

Aspect 33: A non-transitory computer-readable medium storing code for wireless communication, the code comprising instructions executable by a processor to perform a method of any of aspects 19 through 27.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

The term "determine" or "determining" encompasses a wide variety of actions and, therefore, "determining" can include calculating, computing, processing, deriving, investigating, looking up (such as via looking up in a table, a database or another data structure), ascertaining and the like. Also, "determining" can include receiving (such as receiving information), accessing (such as accessing data in a memory) and the like. Also, "determining" can include resolving, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method for wireless communication, comprising:
   appending, during a first encoding stage, a first set of cyclic redundancy check bits having a first size to each code block of a plurality of code blocks;
   concatenating two or more code blocks from the plurality of code blocks into a first set of code blocks, each code block of the two or more code blocks including the appended first set of cyclic redundancy check bits;
   appending, during a second encoding stage, a second set of cyclic redundancy check bits having a second size to the first set of code blocks; and
   transmitting a message comprising the plurality of code blocks including the appended first set of cyclic redundancy check bits and the appended second set of cyclic redundancy check bits.

2. The method of claim 1, further comprising:
   distributing the second set of cyclic redundancy check bits to each code block of the two or more code blocks, wherein a first code block of the two or more code blocks is appended with a first portion of the second set of cyclic redundancy check bits and a second code block of the two or more code blocks is appended with a second portion of the second set of cyclic redundancy check bits.

3. The method of claim 1, further comprising:
   concatenating the first set of code blocks and a second set of code blocks into a third set of code blocks, the second set of code blocks comprising two or more additional code blocks from the plurality of code blocks that each includes the appended first set of cyclic redundancy check bits, wherein the second set of code blocks is appended with the second set of cyclic redundancy check bits; and
   appending, during a third encoding stage, a third set of cyclic redundancy check bits having a third size to the concatenated first set of code blocks and second set of code blocks, wherein the message comprises the plurality of code blocks including the appended first set of cyclic redundancy check bits, the appended second set of cyclic redundancy check bits, and the appended third set of cyclic redundancy check bits.

4. The method of claim 3, further comprising:
   distributing the third set of cyclic redundancy check bits to the first set of code blocks and the second set of code blocks, wherein the first set of code blocks is appended with a first portion of the third set of cyclic redundancy check bits and the second set of code blocks is appended with a second portion of the third set of cyclic redundancy check bits.

5. The method of claim 1, further comprising:
   transmitting a second message indicating a cyclic redundancy check configuration, wherein appending the first set of cyclic redundancy check bits, concatenating the two or more code blocks, and appending the second set of cyclic redundancy check bits is based at least in part on the cyclic redundancy check configuration.

6. The method of claim 5, wherein the second message is transmitted via medium access control (MAC)-control element signaling, downlink control information, radio resource control signaling, or any combination thereof.

7. The method of claim 1, wherein the first encoding stage and the second encoding stage are from a plurality of encoding stages for encoding the message, each encoding stage of the plurality of encoding stages being associated with appending respective sets of cyclic redundancy check bits to one or more code blocks of the plurality of code blocks.

8. The method of claim 1, further comprising:
   determining a set of cyclic redundancy check bits corresponding to respective encoding stages and one or more polynomial functions associated with the set of cyclic redundancy check bits; and
   determining a number of the plurality of code blocks corresponding to the respective encoding stages, wherein appending the first set of cyclic redundancy check bits, concatenating the two or more code blocks, and appending the second set of cyclic redundancy check bits is based at least in part on the set of cyclic redundancy check bits, the one or more polynomial functions, the number of the plurality of code blocks, and the respective encoding stages.

9. The method of claim 1, further comprising:
   receiving a feedback message in response to the transmitted message; and
   retransmitting one or more code blocks from the plurality of code blocks based at least in part on the feedback message indicating a decoding failure associated with the one or more code blocks including the appended first set of cyclic redundancy check bits having the first size or a decoding failure associated with the first set of code blocks including the appended second set of cyclic redundancy check bits having the second size.

10. The method of claim 9, wherein retransmitting the one or more code blocks from the plurality of code blocks comprises:
    retransmitting a single code block based at least in part on the feedback message indicating the decoding failure associated with the one or more code blocks including the appended first set of cyclic redundancy check bits having the first size.

11. The method of claim 9, wherein retransmitting the one or more code blocks from the plurality of code blocks comprises:
    retransmitting the first set of code blocks based at least in part on the feedback message indicating the decoding failure associated with the first set of code blocks including the appended second set of cyclic redundancy check bits having the second size.

12. The method of claim 1, further comprising:
    selecting a cyclic redundancy check encoding scheme from a plurality of cyclic redundancy check encoding schemes, wherein appending the first set of cyclic redundancy check bits, concatenating the two or more code blocks, and appending the second set of cyclic redundancy check bits is based at least in part on the cyclic redundancy check encoding scheme.

13. The method of claim 12, wherein the cyclic redundancy check encoding scheme indicates whether the second set of cyclic redundancy check bits are appended to a last code block of the first set of code blocks or distributed to each code block of the first set of code blocks.

14. The method of claim 12, wherein the cyclic redundancy check encoding scheme is selected from a preconfigured list of cyclic redundancy check encoding schemes.

15. The method of claim 12, wherein the cyclic redundancy check encoding scheme is semi-statically selected based at least in part on a channel type for transmitting the message, a size of respective code blocks from the plurality of code blocks, or a size of code block groups, or any combination thereof.

16. The method of claim 12, wherein the cyclic redundancy check encoding scheme is dynamically selected based at least in part on an error probability associated with transmitting the message.

17. The method of claim 1, wherein a total number of cyclic redundancy check bits of the message comprises a sum of the first set of cyclic redundancy check bits and the second set of cyclic redundancy check bits.

18. The method of claim 1, wherein the second set of cyclic redundancy check bits are appended to a temporally last code block of the first set of code blocks based at least in part on concatenating the two or more code blocks.

19. A method for wireless communication, comprising:
receiving a message comprising a plurality of code blocks, wherein each code block of the plurality of code blocks is appended with a first set of cyclic redundancy check bits having a first size, and wherein two or more concatenated code blocks of the plurality of code blocks are appended with a second set of cyclic redundancy check bits having a second size; and
attempting to decode the plurality of code blocks based at least in part on receiving the message.

20. The method of claim 19, further comprising:
transmitting a feedback message indicating a decoding failure for one or more code blocks including the appended first set of cyclic redundancy check bits, or a decoding failure for a first set of code blocks including the appended second set of cyclic redundancy check bits, or any combination thereof.

21. The method of claim 20, further comprising:
receiving a retransmission of a single code block based at least in part on the feedback message indicating the decoding failure associated with the one or more code blocks including the appended first set of cyclic redundancy check bits.

22. The method of claim 20, further comprising:
receiving a retransmission of the first set of code blocks based at least in part on the feedback message indicating the decoding failure associated with the first set of code blocks including the appended second set of cyclic redundancy check bits.

23. The method of claim 19, further comprising:
receiving a second message indicating a cyclic redundancy check configuration, wherein the message includes the plurality of code blocks having the appended first set of cyclic redundancy check bits and the two or more concatenated code blocks having the appended second set of cyclic redundancy check bits based at least in part on the cyclic redundancy check configuration.

24. The method of claim 23, wherein the second message is received via medium access control (MAC)-control element signaling, downlink control information, radio resource control signaling, or any combination thereof.

25. The method of claim 19, wherein a first code block of the two or more concatenated code blocks is appended with a first portion of the second set of cyclic redundancy check bits and a second code block of the two or more concatenated code blocks is appended with a second portion of the second set of cyclic redundancy check bits.

26. The method of claim 19, wherein the message comprises a third set of cyclic redundancy check bits appended to a concatenation of a first set of code blocks and a second set of code blocks, the first set of code blocks comprising the two or more concatenated code blocks with the second set of cyclic redundancy check bits appended to the first set of code blocks, and the second set of code blocks comprising two or more additional concatenated code blocks with the second set of cyclic redundancy check bits appended to the second set of code blocks, and wherein decoding the message is based at least in part on the third set of cyclic redundancy check bits appended to the concatenation of the first set of code blocks and the second set of code blocks.

27. The method of claim 19, wherein a total number of cyclic redundancy check bits of the message comprises a sum of the first set of cyclic redundancy check bits and the second set of cyclic redundancy check bits.

28. An apparatus for wireless communication, comprising:
a processor;
a memory coupled with the processor; and
instructions stored in the memory and executable by the processor to cause the apparatus to:
append, during a first encoding stage, a first set of cyclic redundancy check bits having a first size to each code block of a plurality of code blocks;
concatenate two or more code blocks from the plurality of code blocks into a first set of code blocks, each code block of the two or more code blocks including the appended first set of cyclic redundancy check bits;
append, during a second encoding stage, a second set of cyclic redundancy check bits having a second size to the first set of code blocks; and
transmit a message comprising the plurality of code blocks including the appended first set of cyclic redundancy check bits and the appended second set of cyclic redundancy check bits.

29. The apparatus of claim 28, wherein the instructions are further executable by the processor to cause the apparatus to:
distribute the second set of cyclic redundancy check bits to each code block of the two or more code blocks, wherein a first code block of the two or more code blocks is appended with a first portion of the second set of cyclic redundancy check bits and a second code block of the two or more code blocks is appended with a second portion of the second set of cyclic redundancy check bits.

30. An apparatus for wireless communication, comprising:
a processor;
a memory coupled with the processor; and
instructions stored in the memory and executable by the processor to cause the apparatus to:
receive a message comprising a plurality of code blocks, wherein each code block of the plurality of code blocks is appended with a first set of cyclic redundancy check bits having a first size, and wherein two or more concatenated code blocks of the plurality of code blocks are appended with a second set of cyclic redundancy check bits having a second size; and attempt to decode the plurality of code blocks based at least in part on receiving the message.

\* \* \* \* \*